United States Patent [19]
Yamasaki

[11] Patent Number: 6,049,481
[45] Date of Patent: Apr. 11, 2000

[54] MULTIPLE-VALUED MASK PROGRAMMABLE READ ONLY MEMORY SEMICONDUCTOR DEVICE WITH IMPROVED WORD LEVEL GENERATOR

[75] Inventor: Kazuyuki Yamasaki, Tokyo, Japan

[73] Assignee: NEC Corporation, Tokyo, Japan

[21] Appl. No.: 09/107,462

[22] Filed: Jun. 30, 1998

[30]     Foreign Application Priority Data

Jun. 30, 1997   [JP]   Japan ................................. 9-173468

[51] Int. Cl.[7] ................................................ G11C 16/00
[52] U.S. Cl. ............................... 365/185.23; 365/189.09; 365/94; 365/203
[58] Field of Search ......................... 365/185.03, 185.23, 365/189.29, 230.06, 94, 203, 204

[56]            References Cited

U.S. PATENT DOCUMENTS 5,572,462  11/1996  Lee ..................................... 365/185.03
5,751,632   5/1998  Choi et al. .......................... 365/185.03
5,818,757  11/1998  So et al. ............................. 365/185.23

*Primary Examiner*—Tan T. Nguyen
*Attorney, Agent, or Firm*—Young & Thompson

[57]               ABSTRACT

A word level generator in a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages. The distributions are separated from each other and do not overlap each other. The word level generator generates a word level which is between a maximum voltage level of lower one of adjacent two of the distributions and a minimum voltage level of higher one of the adjacent two of the distributions, so that all of the mask programmable read only memory cells are permitted to show correct ON/OFF operations for application of different word level voltages, whereby only correct data are obtained from the multiple-valued mask programmable read only memory semiconductor device.

31 Claims, 20 Drawing Sheets

MULTIPLE-VALUED MASK PROGRAMMABLE READ ONLY MEMORY SEMICONDUCTOR DEVICE WITH IMPROVED WORD LEVEL GENERATOR

BACKGROUND OF THE INVENTION

The present invention relates in general to a semiconductor memory device, and more particularly to a multiple-valued mask programmable read only memory semiconductor device with an improved word level voltage generator circuit for generating word level voltages to be supplied to word lines on determination of the multiple values.

In general, the mask programmable read only memory semiconductor device has memory cell arrays which comprise a plurality of mask programmable read only memories, individuals of which have any one of two threshold voltages. Two kirids of the mask programmable read only memories having the two different threshold voltages have impurity diffusion regions implanted with an impurity at different doses. If the mask programmable read only memory cells with the different threshold voltages are applied with a voltage level intermediate between the above two different threshold voltages, then only the mask programmable read only memory cells with the lower threshold voltage turn ON to flow cell-currents through the mask programmable read only memory cells with the lower threshold voltage whilst the remaining mask programmable read only memory cells with the higher threshold voltage remain OFF to flow no cell current through them. The cell currents are supplied to sense amplifiers to be read out thereby obtain binary digit values "0" and "1".

In recent years, however, in order to increase the memory capacity of the memory cell arrays, it was proposed to utilize three different threshold values of the mask programmable read only memory cells so that each of the mask programmable read only memory cells is capable of storing data more than one bit. Such memory device is so called as "multiple-valued mask programmable read only memory semiconductor device. Individuals of multiple-valued mask programmable read only memory cells have any one of three threshold voltages. Three kinds of the mask programmable read only memory cells having the three different threshold voltages have impurity diffusion regions implanted with an impurity at three different doses from each other. If the mask programmable read only memory cells with the three different threshold voltages are applied with a voltage level intermediate between adjacent two of the three different threshold voltages, then only the mask programmable read only memory cells with the lower threshold voltage or voltages than the applied voltage level turn ON to flow cell-currents through the mask programmable read only memory cells whilst the remaining mask programmable read only memory cells with the higher threshold voltage or voltages than the applied voltage level remain OFF to flow no cell current through them. The cell currents are supplied to sense amplifiers to be read out thereby obtain ternary digit values "0", "1" and "2".

It was also proposed to utilize four different threshold values of the mask programmable read only memory cells. Individuals of multiple-valued mask programmable read only memory cells have any one of four threshold voltages. Four kinds of the mask programmable read only memory cells having the four different threshold voltages have impurity diffusion regions implanted with an impurity at four different doses from each other. If the mask programmable read only memory cells with the four different threshold voltages are applied with a voltage level intermediate between adjacent two of the four different threshold voltages, then only the mask programmable read only memory cells with the lower threshold voltage or voltages than the applied voltage level turn ON to flow cell-currents through the mask programmable read only memory cells whilst the remaining mask programmable read only memory cells with the higher threshold voltage or voltages than the applied voltage level remain OFF to flow no cell current through them. The cell currents are supplied to sense amplifiers to be read out thereby obtain two bits of binary digit values "0", "1". The multiple-valued mask programmable read only memory semiconductor device having four kinds of the mask programmable read only memory cells with the four different threshold voltages will be described in detail with reference to FIGS. 1 and 2. FIG. 1 is a block diagram illustrative of the conventional multiple-valued mask programmable read only memory semiconductor device having four kinds of the mask programmable read only memory cells with the four different threshold voltages.

The conventional multiple-valued mask programmable read only memory semiconductor device has a memory cell array 110 having four kinds of mask programmable read only memory cells 111 with four different threshold voltages. Each of the mask programmable read only memory cells 111 comprises a MOS field effect transistor having a gate which is connected to a word line 112. The above four kinds of the mask programmable read only memory cells 111 have four different threshold voltages, for example, a first threshold voltage Vt0 (0.5 V), a second threshold voltage Vt1 (1.5 V), a third threshold voltage Vt2 (2.5 V), and a fourth threshold voltage Vt3 (3.5 V). The conventional multiple-valued mask programmable read only memory semiconductor device also has a word level generator circuit 120 connected to the word lines 112 for supplying any one of three different word level voltages, each of which lies adjacent two of the four threshold voltages. The three different word level voltages comprise a first word level of 1.0 V, a second word level of 2.0 V and a third word level of 3.0 V, The word level generator circuit 120 is connected through the word lines to the gates of the four kinds of the mask programmable read only memory cells 111. If the word level generator circuit 120 generates the first word level of 1.0 V, then only the mask programmable read only memory cells 111 having the first threshold voltage Vt0 (0.5 V) turn ON, whilst the remaining three kinds of the mask programmable read only memory cells 111 having the second, third and fourth threshold voltages Vt1 (1.5 V), Vt2 (2.5) and Vt3 (3.5) remain OFF. If the word level generator circuit 120 generates the second word level of 2.0 V, then two kinds of the mask programmable read only memory cells 111 having the first and second threshold voltages Vt0 (0.5 V) and Vt1 (1.5 V) turn ON, whilst the remaining two kinds of the mask programmable read only memory cells 111 having the third and fourth threshold voltages, Vt2 (2.5) and Vt3 (3.5) remain OFF. If the word level generator circuit 120 generates the third word level of 3.0 V, then three kinds of the mask programmable read only memory cells 111 having the first, second and third threshold voltages Vt0 (0.5 V), Vt1 (1.5 V) and Vt2 (2.5) turn ON, whilst the remaining mask programmable read only memory cells 111 having the fourth threshold voltage Vt3 (3.5) remains OFF.

The conventional multiple-valued mask programmable read only memory semiconductor device also has a sense amplifier 130 which is connected to drains of the MOS field effect transistors as the mask programmable read only memory cells 111 Sources of the MOS field effect transistors as the mask programmable read only memory cells 111 are connected to a ground line. Further, first, second and third latch circuits 140, 150 and 160 are connected to the sense amplifier 130 for receiving outputs from the sense amplifier 130. A data decoder circuit 170 is also provided which is connected to the first, second and third latch circuits 140, 150 and 160 for receiving outputs from the first, second and third latch circuits 140, 150 and 160. First and second output buffer circuits 180 and 190 are provided which are connected to the data decoder circuit 170 for receiving outputs from the data decoder circuit 170. The first output buffer circuit 180 outputs binary digit output signals "1" or "0". The second output buffer circuit 190 outputs binary digit output signals "1" or "0".

The following table 1 illustrates relationships among the above four threshold voltages, ON/OFF states of the individual mask programmable read only memory cells 111 for three different word levels and output data from the first and second output buffer circuits.

TABLE 1

| threshold voltage | word level | | | output data | |
|---|---|---|---|---|---|
| | first (1.0 V) | second (2.0 V) | third (3.0 V) | first-buffer | second-buffer |
| 0.5 V(Vt0) | ON | ON | ON | 0 | 0 |
| 1.5 V(Vt1) | OFF | ON | ON | 0 | 1 |
| 2.5 V(Vt2) | OFF | OFF | ON | 1 | 0 |
| 3.5 V(Vt3) | OFF | OFF | OFF | 1 | 1 |

The above table 1 shows the followings. The first kind of the mask programmable read only memory cells 111 having the first threshold voltage Vt0 of 0.5 V is operated to turn ON when any of the first, second and third word level voltages is supplied by the word level generator circuit 120. The second kind of the mask programmable read only memory cells 111 having the second threshold voltage Vt1 of 1.5 V is operated to turn ON when any of the second and third word level voltages is supplied by the word level generator circuit 120, but the second kind of the mask programmable read only memory cells 111 remains OFF only when the first word level voltage is applied The third kind of the mask programmable read only memory cells 111 having the third threshold voltage Vt2 of 2.5 V is operated to turn ON only when the third word level voltage is supplied by the word level generator circuit 120, but the third kind of the mask programmable read only memory cells 111 remains OFF when any of the first and second word level voltages is applied. The fourth kind of the mask programmable read only memory cells 111 having the fourth threshold voltage Vt3 of 3.5 V is operated to remain OFF when any of the first, second and third word level voltages is supplied by the word level generator circuit 120. Consequently, the four kinds of the mask programmable read only memory cells 111 having the first, second, third and fourth threshold voltages Vt0, Vt1, Vt2 and Vt3 show individually different combinations of the ON/OFF states for applications of the three different word levels. This means that it is possible to determine the four kinds of the mask programmable read only memory cells 111 or determine the four different threshold voltages of the mask programmable read only memory cells 111 by confirming the ON/OFF state combinations for applications of the three different word levels. This further means that it is possible to allocate two bits of binary digits to the four kinds of the mask programmable read only memory cells 111 or the four different threshold voltages of the mask programmable read only memory cells 111. The data decoder circuit 170 is operated to decode the data from four kinds of combinations of the ON/OFF states of individuals of the mask programmable read only memory cells 111 for applications of the three different word levels. The three different word levels are in general given by step-up of the word levels as illustrated in FIG. 2, which is a diagram illustrative of a profile of increase in step-up of word levels from the first to third levels supplied by a word level generator circuit in the conventional multiple-valued mask programmable read only memory semiconductor device of FIG. 1. The three different word levels are pre-determined in consideration of relationship to the different threshold voltages of the mask programmable read only memory cells 111.

The word level generator circuit 120 generates the word levels increasing in step-up from the first to third word levels which are supplied through the word lines to the gates of the four kinds of the mask programmable read only memory cells 111 having the four different threshold voltages. As a result, the four kinds of the mask programmable read only memory cells 111 show different variations of ON/OFF states as shown in the above Table 1. The sense amplifier 130 is operated to sense the ON/OFF states of the four kinds of the mask programmable read only memory cells 111 for every three levels of the word voltages applied. When the first word level voltage is applied by the word level generator circuit 120, then the ON/OFF states of the four kinds of the mask programmable read only memory cells 111 are detected by the sense amplifier 120 and then held by the first latch circuit 140 When the word voltage level is increased or stepped up to the second level so that the second word level voltage is applied by the word level generator circuit 120. then the ON/OFF states of the four kinds of the mask programmable read only memory cells 111 are detected by the sense amplifier 120 and then held by the second latch circuit 150. When the word voltage level is increased or stepped up to the third level so that the third word level voltage is applied by the word level generator circuit 120, then the ON/OFF states of the four kinds of the mask programmable read only memory cells 111 are detected by the sense amplifier 120 and then held by the third latch circuit 160. The data decoder circuit 170 fetches data about ON/OFF states of the mask programmable read only memory cells 111 held in the first to third latch circuits 140, 150 and 160 in order to decode the combinations of the ON/OFF states of the mask programmable read only memory cells 111 for every steps of the first to third word levels. Two bits of the decoded binary digit signals are outputted through the first and second output buffer circuits 180 and 190 respectively.

As described above, the three different word levels are determined pre-supposing that the every mask programmable read only memory cells 111 have any of the four threshold voltages. Actually, however, some of the mask programmable read only memory cells 111 may have threshold voltages which are slightly different from the above four threshold voltages. Even though the impurity is diffused into the diffusion region of the MOS field effect transistor as the mask programmable read only memory cell 111 to attempt to obtain a specific one of the four different threshold voltages, this mask programmable read only memory cell 111 may have a threshold voltage slightly different from the intended one of the four different threshold voltages. Further, even a dose of the impurity implantation into the diffusion region of the MOS field effect transistor as the mask programmable read only memory cell 111 to attempt to obtain a specific one of the four different threshold voltages, this mask programmable read only memory cell 111 may have a threshold voltage slightly different from the intended one of the four different threshold voltages. Accordingly, the mask programmable read only memory cells 111 have a distribution in the number of the mask programmable read only memory cells 111 versus variations of the actual threshold voltage from any one of the four intended threshold voltages different from each other. The distribution in the number of the mask programmable read only memory cells 111 versus variations of the actual threshold voltage from any one of the four intended threshold voltages is due to manufacturing processes and other factors. The width of the distribution or variation profile is also variable. FIG. 3 is a graph illustrative of a distribution in the number of the mask programmable read only memory cells 111 versus variations of the actual threshold voltage from any one of the second and third threshold voltages Vt1 and Vt2, wherein a read line dtbVt2 represents the third threshold voltage distribution having a width of ±0.3 V from the third threshold voltage Vt2, whilst a broken line dtbVt2' represents the third threshold voltage distribution having a width of ±0.6 V from the third threshold voltage Vt2. Some of the mask programmable read only memory cells 111 have threshold voltages which fall into the second or third threshold voltage distributions dtbVt1 or dtbVt2 or dtbVt2'.

By contrast, the word levels have no variation nor distribution from the predetermined voltage levels. The second word level is fixed at an intermediate between the second threshold voltage Vt1 and the third threshold voltage Vt2 independently from the distribution in the number of the mask programmable read only memory cells 111 versus variations of the actual threshold voltage from any one of the second and third threshold voltages Vt1 and Vt2. The large distribution represented by dtbVt2' in the number of the mask programmable read only memory cells 111 versus variations of the actual threshold voltage from any one of the second and third threshold voltages Vt1 and Vt2 has a base which superimposes over the second word level. In this case, a small number of the third kind of the mask programmable read only memory cells 111 as having attempted to possess the third threshold voltage Vt2, actually, however, possess threshold voltages lower than the third threshold voltage Vt2 by not less than 0.5 V. This results in that the small number of the third kind of the mask programmable read only memory cells 111 possessing threshold voltages lower than the third threshold voltage Vt2 by not less than 0.5 V turn ON by applying the second word level although all of the third kind of the mask programmable read only memory cells 111 should have to remain in the OFF state. As a result, incorrect output data are obtained.

Japanese laid-open patent publication No. 7-176636, it is attempts to solve the above problem by widening differences among the threshold voltages. This conventional attempt widens a range of the threshold voltages, for which reason there is a limit to widen the differences of the threshold voltages. If there is a large distribution represented by dtbVt2' in the number of the mask programmable read only memory cells 111 versus variations of the actual threshold voltage from any one of the predetermined or intended threshold voltages, then the above problem with superimposition of the base of the distribution over the fixed word level to cause the incorrect outputs. In the light of this, the conventional attempt does not solve basically the above problem.

In the above circumstances, it had been required to develop a novel multiple-valued mask programmable read only memory semiconductor device free from the above problem.

SUMMARY OF THE INVENTION

Accordingly, it is an object of the present invention to provide a novel multiple-valued mask programmable read only memory semiconductor device free from the above problems.

It is a further object of the present invention to provide a novel multiple-valued mask programmable read only memory semiconductor device ensuring correct output data even if mask programmable read only memory cells have relatively large distributions in the number of the cells versus the threshold voltage.

It is a still further object of the present invention to provide a novel multiple-valued mask programmable read only memory semiconductor device ensuring correct output data, without widening differences of the threshold voltages, even if mask programmable read only memory cells have relatively large distributions in the number of the cells versus the threshold voltage.

The above and other objects, features and advantages of the present invention will be apparent from the following descriptions.

The present invention provides a word level generator in a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages, and the distributions being separated from each other and having no overlap to each other, wherein the word level generator is capable of generating at least a word level which is between a maximum voltage level of lower one of adjacent two of the distributions and a minimum voltage level of higher one of the adjacent two of the distributions, so that all of the mask programmable read only memory cells are permitted to show correct ON/OFF operations for application of different word level voltages and whereby no incorrect data are obtained from the multiple-valued mask programmable read only memory semiconductor device.

The present invention also provides a method of determining a word level, wherein the word level is both higher than a maximum voltage value of a first distribution in threshold voltage of first type mask programmable read only memory cells having intended to have a first threshold voltage and wherein the word level is lower than a minimum voltage value of a second distribution in threshold voltage of second type mask programmable read only memory cells having intended to have a second threshold voltage, provided that the first and second distributions are separated from each other to have no overlap so that the first distribution is lower in threshold voltage than the second distribution. Namely, the word level is set between the adjacent two of the distributions in threshold voltage of different kinds of the mask programmable read only memory cells.

BRIEF DESCRIPTION OF THE DRAWINGS

Preferred embodiments according to the present invention will be described in detail with reference to the accompanying drawings.

DESCRIPTION OF THE PREFERRED EMBODIMENT

Figure 1:
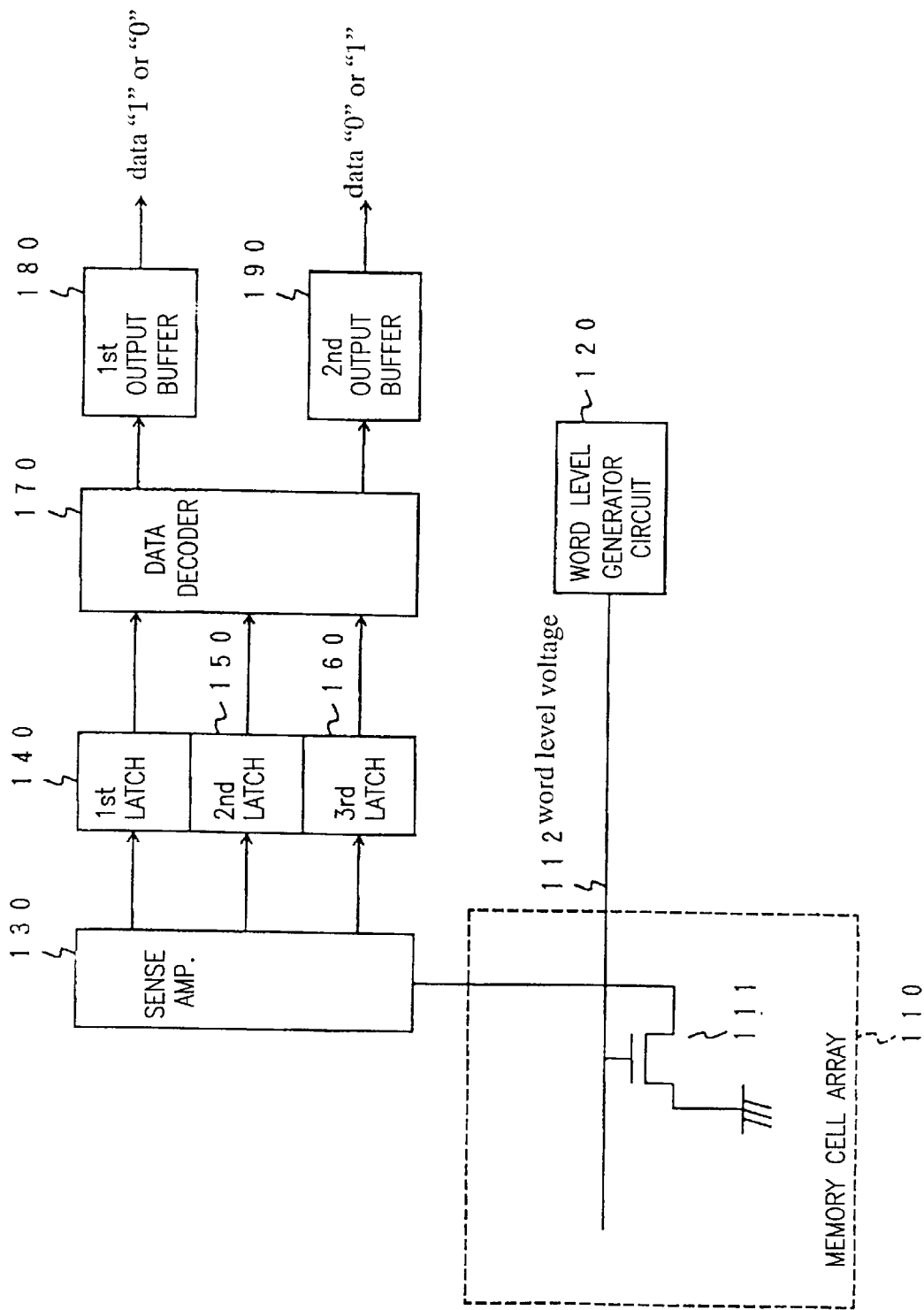
FIG. 1 is a block diagram illustrative of the conventional multiple-valued mask programmable read only memory semiconductor device having four kinds of the mask programmable read only memory cells with the four different threshold voltages.
Figure 2:
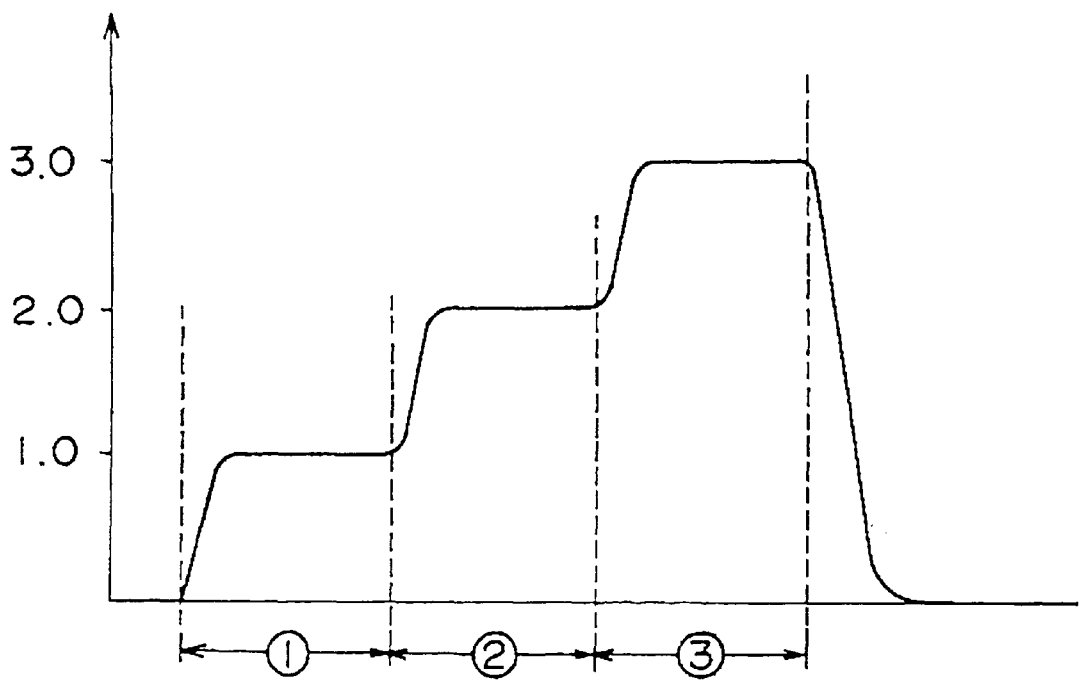
FIG. 2 is a diagram illustrative of a profile of increase in step-up of word levels from the first to third levels supplied by a word level generator circuit in the conventional multiple-valued mask programmable read only memory semiconductor device of FIG. 1.
Figure 3:
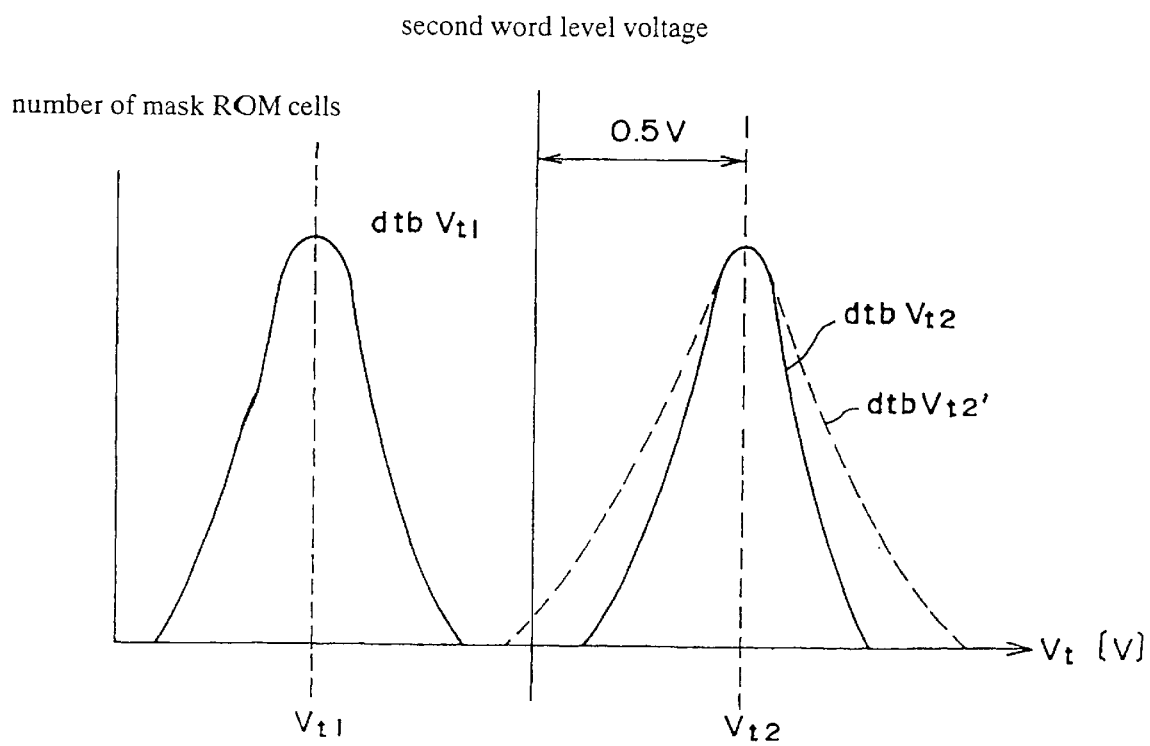
FIG. 3 is a graph illustrative of a distribution in the number of the mask programmable read only memory cells 111 versus variations of the actual threshold voltage from any one of the second and third threshold voltages Vt1 and Vt2, wherein a read line dtbVt2 represents the third threshold voltage distribution having a width of ±0.3 V from the third threshold voltage Vt2, whilst a broken line dtbVt2' represents the third threshold voltage distribution having a width of ±0.6 V from the third threshold voltage Vt2.

The present invention provides a word level generator in a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages, and the distributions being separated from each other and having no overlap to each other, wherein the word level generator is capable of generating at least a word level which is between a maximum voltage level of lower one of adjacent two of the distributions and a minimum voltage level of higher one of the adjacent two of the distributions, so that all of the mask programmable read only memory cells are permitted to show correct ON/OFF operations for application of different word level voltages and whereby no incorrect data are obtained from the multiple-valued mask programmable read only memory semiconductor device The present invention also provides a method of determining a word level, wherein the word level is both higher than a maximum voltage value of a first distribution in threshold voltage of first type mask programmable read only memory cells having intended to have a first threshold voltage and wherein the word level is lower than a minimum voltage value of a second distribution in threshold voltage of second type mask programmable read only memory cells having intended to have a second threshold voltage, provided that the first and second distributions are separated from each other to have no overlap so that the first distribution is lower in threshold voltage than the second distribution. Namely, the word level is set between the adjacent two of the distributions in threshold voltage of different kinds of the mask programmable read only memory cells.

The present inventions are achieved by confirming the reason why the threshold voltages of the individual kinds of the mask programmable read only memory cells are distributed A dose of impurity implantation into an active region of the mask programmable read only memory cell is controlled to attempt to obtain an intended threshold voltage. Actually, however, the threshold voltage of the same kind of the mask programmable read only memory cells are distributed and varied from the intended threshold voltage. This means that the actual amount of the impurity diffused into the diffusion region may be varied from the intended amount of the impurity. It was confirmed that the amount of the impurity diffused in the active region of the mask programmable read only memory cell is varied due to the amounts of the doses of impurity into the active regions of the adjacent mask programmable read only memory cells positioned adjacent to and around the above mask programmable read only memory cell. If the adjacent mask programmable read only memory cells positioned adjacent to and around the specific mask programmable read only memory cell have amounts of doses which are higher than an amount of the dose of the specific mask programmable read only memory cell, then the impurities intended to be diffused into the active regions of the adjacent mask programmable read only memory cells are, actually, however, likely to be seeped out of the active regions of the adjacent mask programmnable read only memory cells to be permeated into the active region of the specific mask programmable read only memory cell. As a result, the amount of the impurity diffused into the active region of the specific mask programmable read only memory cell is thus increased, whereby the threshold voltage of the specific mask programmable read only memory cell is risen from the predetermined or intended threshold voltage. If, however, the adjacent mask programmable read only memory cells positioned adjacent to and around the specific mask programmable read only memory cell have amounts of doses which are lower than an amount of the dose of the specific mask programmable read only memory cell, then the impurities intended to be diffused into the active region of the specific mask programmable read only memory cell is, actually, however, likely to be seeped out of the active region of the specific mask programmable read only memory cell to be permeated into the active regions of the adjacent mask programmable read only memory cells. As a result, the amount of the impurity diffused into the active region of the specific mask programmable read only memory cell is thus decreased, whereby the threshold voltage of the specific mask programmable read only memory cell is fallen from the predetermined or intended threshold voltage. It is possible to suppose the distribution in threshold voltage of the mask programmable read only memory cells in consideration of the amounts of the impurities in the active regions of the adjacent mask programmable read only memory cells. For example, if the adjacent mask programmable read only memory cells have various threshold voltages which are, however, higher than the intended threshold voltage of the specific mask programmable read only memory cell, it is possible to suppose the widest distribution in threshold voltage of the specific mask programmable read only memory cell by assuming that all of the adjacent mask programmable read only memory cells uniformly have a maximum threshold voltage during the various threshold voltages of the adjacent mask programmable read only memory cells. As a result, the word level may be set to be separated from the distribution in threshold voltage of the specific mask programmable read only memory cell. The above method of supposing the distribution in threshold voltage of the specific mask programmable read only memory cell is applied to all of the mask programmable read only memory cells so that the word level can be set between the maximum value of the lower distribution in threshold voltage of the mask programmable read only memory cells and the minimum value of the higher distribution in threshold voltage of the mask programmable read only memory cells, whereby the word level does not overlap any distributions in threshold voltage of the mask programmable read only memory cells.

The present invention provides a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages, and the distributions being separated from each other and having no overlap to each other, wherein the word level generator is capable of generating at least a word level which is between a maximum voltage level of lower one of adjacent two of the distributions and a minimum voltage level of higher one of the adjacent two of the distributions so that the word level does not overlap any threshold voltage ranges belonging to the any distributions. The expression "the distribution in threshold voltage of the mask programmable read only memory cells" means the distribution in number of the mask programmable read only memory cells versus variation of actual threshold voltages from the predetermined threshold voltage. Namely, the word level generator circuit is capable of determining the word level at a level between the maximum value of the lower distribution in threshold voltage of one kind of the mask programmable read only memory cells and the minimum value of the higher distribution in threshold voltage of a different kind of the mask programmable read only memory cells.

The word level generator circuit may be realized by various circuit configurations provided that the circuit has the above capability of determining the word level at a level between the maximum value of the lower distribution in threshold voltage of a first kind of the mask programmable read only memory cells and the minimum value of the higher distribution in threshold voltage of a second kind of the mask programmable read only memory cells.

The first type of the word level generator has the above capability of determining the word level at a level between the maximum value of the lower distribution in threshold voltage of a first kind of the mask programmable read only memory cells and the minimum value of the higher distribution in threshold voltage of a second kind of the mask programmable read only memory cells.

In this case, the first type of the word level generator may, for example, comprise a first reference level generator circuit having a transistor with the same structure as the first kind of the mask programmable read only memory cells for generating a first reference level signal, a second reference level generator circuit having a transistor with the same structure as the second kind of the mask programmable read only memory cells for generating a second reference level signal, and a word level generator connected to the first and second reference level generator circuits for receiving the first and second reference level signals from the first and second reference level generator circuits in order to generate a word level intermediate between the first and second reference levels.

In the above case, the second type of the word level generator may, for example, comprise a first reference level generator circuit for generating a first reference level which corresponds to a maximum value of the lower distribution, a second reference level generator circuit for generating a second reference level which corresponds to a minimum value of the higher distribution, and a word level generator connected to the first and second reference level generator circuits for receiving the first and second reference level signals from the first and second reference level generator circuits in order to generate a word level which lies between the first and second reference levels. It may be available that the word level generator generates a word level which is an intermediate level between the first and second reference levels. It is further available that the word level generator may comprise a voltage-divider circuit connected to the first and second reference level generator circuits for receiving the first and second reference levels to generate a voltage at a level between the first and second reference levels and a current-amplifier circuit connected to the voltage-divider circuit for receiving the output from the voltage-divider circuit to conduct an amplification in current of the output from the voltage-divider circuit. It is furthermore available that the first reference level generator circuit comprises a first reference level generator circuit for generating the first reference level signal and a first current amplifier circuit connected to the first reference level generator circuit for receiving the first reference level signal from the first reference level generator circuit in order to conduct a current amplification of the first reference level signal, and also available that the second reference level generator circuit comprises a second reference level generator circuit for generating the second reference level signal and a second current amplifier circuit connected to the second reference level generator circuit for receiving the second reference level signal from the second reference level generator circuit in order to conduct a current amplification of the second reference level signal. It is moreover available that the first reference level generator circuit has at least a first MOS field effect transistor having a first threshold voltage which corresponds to the first reference level and also available that the second reference level generator circuit has at least a second MOS field effect transistor having a second threshold voltage which corresponds to the second reference level. It is still more available that each of the first and second MOS field effect transistors has a diode connection between a drain and a gate to allow the first and second MOS field effect transistors to perform as diodes so that a drain voltage of the first MOS field effect transistor is fetched as the first reference level signal and a drain voltage of the second MOS field effect transistor is fetched as the second reference level signal. It is also available that the first reference level generator circuit further has a first set of peripheral MOS field effect transistors provided adjacent to and around the first MOS field effect transistor, where the first MOS field effect transistor has an impurity diffusion region having the same amount of impurity as an impurity diffusion region of a mask programmable read only memory cell which has a threshold voltage equal to a first predetermined threshold voltage from which actual threshold voltages of the first kind of the mask programmable read only memory cells are varied with the lower distribution, whilst the first set of the peripheral MOS field effect transistors have impurity diffusion regions having the same amount of impurity as an impurity diffusion region of a mask programmable read only memory cell which has a predetermined threshold voltage belonging to a highest one of all the distributions, and also available that the second reference level generator circuit further has a second set of peripheral MOS field effect transistors provided adjacent to and around the second MOS field effect transistor, where the second MOS field effect transistor has an impurity diffusion region having the same amount of impurity as an impurity diffusion region of a mask programmable read only memory cell which has a threshold voltage equal to a second predetermined threshold voltage from which actual threshold voltages of the second kind of the mask programmable read only memory cells are varied with the higher distribution, whilst the second set of the peripheral MOS field effect transistors have impurity diffusion regions having the same amount of impurity as an impurity diffusion region of a mask programmable read only memory cell which a predetermined threshold voltage belonging to a lowest one of all the distributions. It is also available that a plurality of word level generator circuits are provided for individually generate different word levels which lie in individual intermediate ranges between adjacent twos of the distributions.

The present invention also provides a device for determining a word level to be both higher than a maximum voltage value of a first distribution in threshold voltage of first type mask programmable read only memory cells having intended to have a first threshold voltage and wherein the word level is lower than a minimum voltage value of a second distribution in threshold voltage of second type mask programmable read only memory cells having intended to have a second threshold voltage, provided that the first and second distributions are separated from each other to have no overlap so that the first distribution is lower in threshold voltage than the second distribution. It is available that the device comprises: a first reference level generator circuit having a transistor with the same structure as the first kind of the mask programmable read only memory cells for generating a first reference level signal; a second reference level generator circuit having a transistor with the same structure as the second kind of the mask programmable read only memory cells for generating a second reference level signal; and a word level generator connected to the first and second reference level generator circuits for receiving the first and second reference level signals from the first and second reference level generator circuits in order to generate a word level intermediate between the first and second reference levels. It is also available that the device comprises: a first reference level generator circuit for generating a first reference level which corresponds to a maximum value of the first distribution; a second reference level generator circuit for generating a second reference level which corresponds to a minimum value of the second distribution; and a word level generator connected to the first and second reference level generator circuits for receiving the first and second reference level signals from the first and second reference level generator circuits in order to generate a word level which lies between the first and second reference levels. It is further available that the word level generator generates a word level which is an intermediate level between the first and second reference levels. It is also available that the word level generator comprises: a voltage-divider circuit connected to the first and second reference level generator circuits for receiving the first and second reference levels to generate a voltage at a level between the first and second reference levels; and a current-amplifier circuit connected to the voltage-divider circuit for receiving the output from the voltage-divider circuit to conduct an amplification in current of the output from the voltage-divider circuit. It is further available that the first reference level generator circuit comprises a first reference level generator circuit for generating the first reference level signal; and a first current amplifier circuit connected to the first reference level generator circuit for receiving the first reference level signal from the first reference level generator circuit in order to conduct a current amplification of the first reference level signal, and also available that the second reference level generator circuit comprises: a second reference level generator circuit for generating the second reference level signal; and a second current amplifier circuit connected to the second reference level generator circuit for receiving the second reference level signal from the second reference level generator circuit in order to conduct a current amplification of the second reference level signal. It is furthermore available that the first reference level generator circuit has at least a first MOS field effect transistor having a first threshold voltage which corresponds to the first reference level, and wherein the second reference level generator circuit has at least a second MOS field effect transistor having a second threshold voltage which corresponds to the second reference level. It is moreover available that each of the first and second MOS field effect transistors has a diode connection between a drain and a gate to allow the first and second MOS field effect transistors to perform as diodes so that a drain voltage of the first MOS field effect transistor is fetched as the first reference level signal and a drain voltage of the second MOS field effect transistor is fetched as the second reference level signal. It is also available that the first reference level generator circuit further has a first set of peripheral MOS field effect transistors provided adjacent to and around the first MOS field effect transistor, where the first MOS field effect transistor has an impurity diffusion region having the same amount of impurity as an impurity diffusion region of a mask programmable read only memory cell which has a threshold voltage equal to a first predetermined threshold voltage from which actual threshold voltages of the first kind of the mask programmable read only memory cells are varied with the first distribution, whilst the first set of the peripheral MOS field effect transistors have impurity diffusion regions having the same amount of impurity as an impurity diffusion region of a mask programmable read only memory cell which has a predetermined threshold voltage belonging to a highest one of all the distributions, and also available that the second reference level generator circuit further has a second set of peripheral MOS field effect transistors provided adjacent to and around the second MOS field effect transistor, where the second MOS field effect transistor has an impurity diffusion region having the same amount of impurity as an impurity diffusion region of a mask programmable read only memory cell which has a threshold voltage equal to a second predetermined threshold voltage from which actual threshold voltages of the second kind of the mask programmable read only memory cells are varied with the second distribution, whilst the second set of the peripheral MOS field effect transistors have impurity diffusion regions having the same amount of impurity as an impurity diffusion region of a mask programmable read only memory cell which a predetermined threshold voltage belonging to a lowest one of all the distributions. It is available that a plurality of word level generator circuits are provided for individually generate different word levels which lie in individual intermediate ranges between adjacent twos of the distributions.

The present invention also provides a multiple-valued mask programmable read only memory semiconductor device comprising: a memory cell array including a plurality of kinds of mask programmable read only memory cells having a plurality of distributions in number of the mask programmable read only memory cells versus variation of actual threshold voltages from predetermined threshold voltages, and the distributions being separated from each other and having no overlap to each other; a sense amplifier connected to the mask programmable read only memory cells for sensing ON/OFF states of said mask programmable read only memory cells a plurality of latch circuits connected to the sense amplifier for receiving output signals about the ON/OFF states from said sense amplifier to hold the output signals; a decoder circuit connected to the latch circuits for receiving the output signals from the latch circuits to decode the output signals into data about the ON/OFF states; a plurality of output buffer circuits connected to the decoder circuit for outputting the data about the ON/OFF states; and a word level generator connected to gates of the mask programmable read only memory cells for supplying at least one word level for controlling ON/OFF states of said mask programmable read only memory cells, wherein the word level generator is capable of generating at least a word level which is between a maximum voltage level of lower one of adjacent two of the distributions and a minimum voltage level of higher one of the adjacent two of the distributions.

It is available that the word level generator comprises a first reference level generator circuit having a transistor with the same structure as the first kind of the mask programmable read only memory cells for generating a first reference level signal; a second reference level generator circuit having a transistor with the same structure as the second kind of the mask programmable read only memory cells for generating a second reference level signal; and a word level generator connected to the first and second reference level generator circuits for receiving the first and second reference level signals from the first and second reference level generator circuits in order to generate a word level intermediate between the first and second reference levels. It is also available that the word level generator comprises. a first reference level generator circuit for generating a first reference level which corresponds to a maximum value of the lower distribution; a second reference level generator circuit for generating a second reference level which corresponds to a minimum value of the higher distribution; and a word level generator connected to the first and second reference level generator circuits for receiving the first and second reference level signals from the first and second reference level generator circuits in order to generate a word level which lies between the first and second reference levels. It is further available that the word level generator generates a word level which is an intermediate level between the first and second reference levels. It is furthermore available that the word level generator comprises a voltage-divider circuit connected to the first and second reference level generator circuits for receiving the first and second reference levels to generate a voltage at a level between the first and second reference levels; and a current-amplifier circuit connected to the voltage-divider circuit for receiving the output from the voltage-divider circuit to conduct an amplification in current of the output from the voltage-divider circuit. It is moreover available that the first reference level generator circuit comprises: a first reference level generator circuit for generating the first reference level signal; and a first current amplifier circuit connected to the first reference level generator circuit for receiving the first reference level signal from the first reference level generator circuit in order to conduct a current amplification of the first reference level signal, and also available that the second reference level generator circuit comprises: a second reference level generator circuit for generating the second reference level signal; and a second current amplifier circuit connected to the second reference level generator circuit for receiving the second reference level signal from the second reference level generator circuit in order to conduct a current amplification of the second reference level signal. It is still more available that the first reference level generator circuit has at least a first MOS field effect transistor having a first threshold voltage which corresponds to the first reference level, and wherein the second reference level generator circuit has at least a second MOS field effect transistor having a second threshold voltage which corresponds to the second reference level. It is yet more available that each of the first and second MOS field effect transistors has a diode connection between a drain and a gate to allow the first and second MOS field effect transistors to perform as diodes so that a drain voltage of the first MOS field effect transistor is fetched as the first reference level signal and a drain voltage of the second MOS field effect transistor is fetched as the second reference level signal It is also available that the first reference level generator circuit further has a first set of peripheral MOS field effect transistors provided adjacent to and around the first MOS field effect transistor, where the first MOS field effect transistor has an impurity diffusion region having the same amount of impurity as an impurity diffusion region of a mask programmable read only memory cell which has a threshold voltage equal to a first predetermined threshold voltage from which actual threshold voltages of the first kind of the mask programmable read only memory cells are varied with the lower distribution, whilst the first set of the peripheral MOS field effect transistors have impurity diffusion regions having the same amount of impurity as an impurity diffusion region of a mask programmable read only memory cell which has a predetermined threshold voltage belonging to a highest one of all the distributions, and also available that the second reference level generator circuit further has a second set of peripheral MOS field effect transistors provided adjacent to and around the second MOS field effect transistor, where the second MOS field effect transistor has an impurity diffusion region having the same amount of impurity as an impurity diffusion region of a mask programmable read only memory cell which has a threshold voltage equal to a second predetermined threshold voltage from which actual threshold voltages of the second kind of the mask programmable read only memory cells are varied with the higher distribution, whilst the second set of the peripheral MOS field effect transistors have impurity diffusion regions having the same amount of impurity as an impurity diffusion region of a mask programmable read only memory cell which a predetermined threshold voltage belonging to a lowest one of all the distributions. It is also available that a plurality of word level generator circuits are provided for individually generate different word levels which lie in individual intermediate ranges between adjacent twos of the distributions.

FIRST EMBODIMENT

A first embodiment according to the present invention will be described in detail with reference to FIGS. 4 through 11.

A novel word level generator is provided in a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages, and the distributions are separated from each other and have no overlap to each other, wherein the word level generator is capable of generating a word level which is between a maximum voltage level of lower one of adjacent two of the distributions and a minimum voltage level of higher one of the adjacent two of the distributions, so that all of the mask programmable read only memory cells are permitted to show correct ON/OFF operations for application of different word level voltages and whereby no incorrect data are obtained from the multiple-valued mask programmable read only memory semiconductor device.

Figure 4:
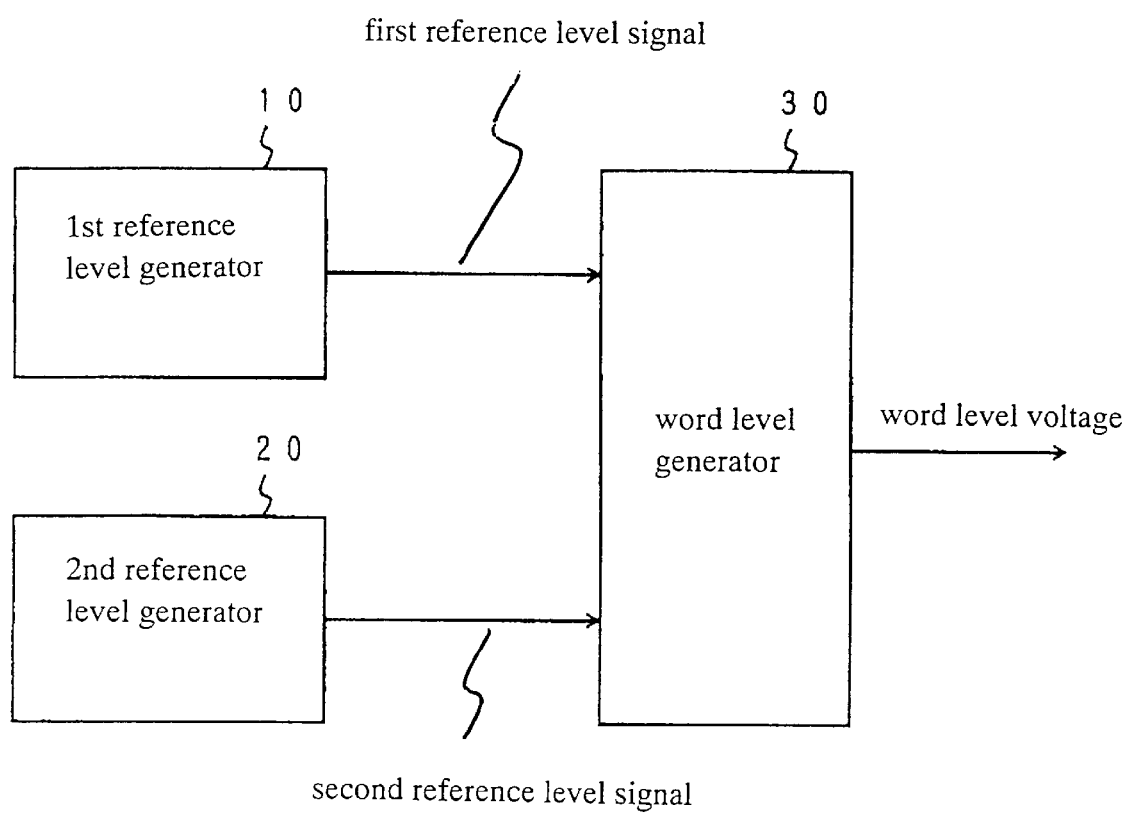
FIG. 4 is a block diagram illustrative of a novel word level generator provided for supplying word levels to mask programmable read only memory cells in a first embodiment in accordance with the present invention.
Figure 5:
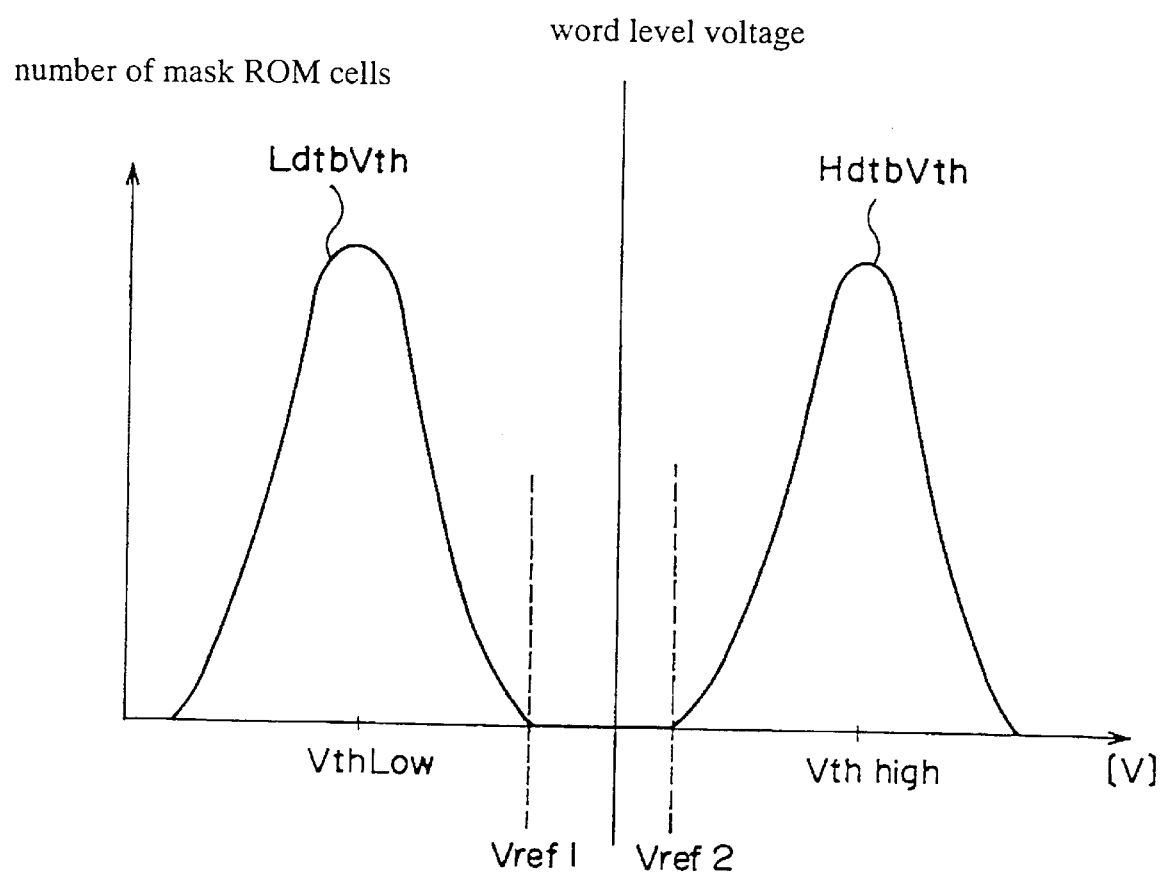
FIG. 5 is a graph illustrative of a relationship between a word level generated by a word level generator of FIG. 4 and adjacent two of distributions in threshold voltages of plural kinds mask programmable read only memory cells of a first embodiment in accordance with the present invention.

As illustrated in FIGS. 4 and 5, the word level generator comprises a first reference level generator circuit 10 for generating a first reference level Vref1 which corresponds to a maximum value of the lower distribution LdtbVth, a second reference level generator circuit 20 for generating a second reference level Vref2 which corresponds to a minimum value of the higher distribution HdtbVth, and a word level generator 30 connected to the first and second reference level generator circuits 10 and 20 for receiving the first and second reference level signals from the first and second reference level generator circuits 10 and 20 in order to generate a word level which lies between the first and second reference levels Vref1 and Vref2. The lower distribution LdtbVth belongs to a lower predetermined threshold voltage Vth-low that the first kind of the mask programmable read only memory cells have been intended to have. The higher distribution HdtbVth belongs to a higher predetermined threshold voltage Vth-high that the first kind of the mask programmable read only memory cells have been intended to have. As a result, the word level generated by the word level generator does not overlap any of the lower and higher distributions LdtbVth and HdtbVth.

Figure 6:
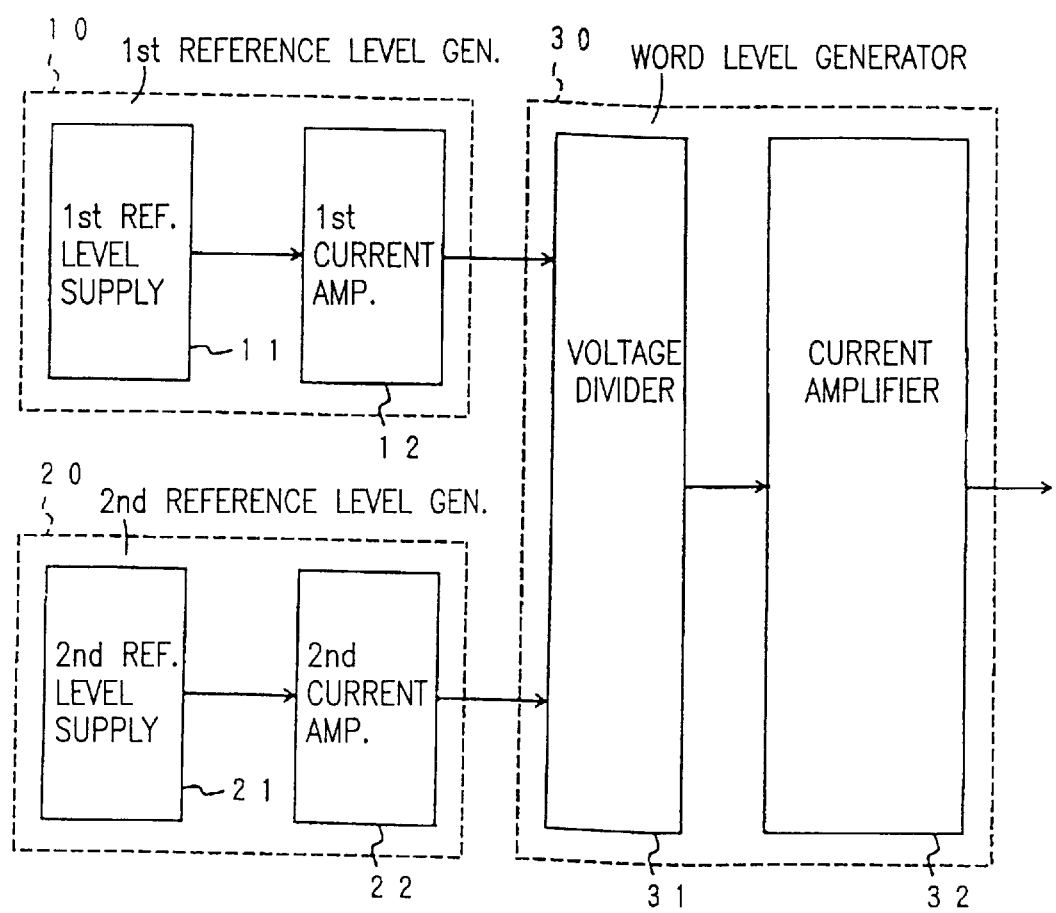
FIG. 6 is a block diagram illustrative of circuit configurations of a novel word level generator of FIG. 4 in a first embodiment in accordance with the present invention.

In considerations of a slight possibility of variations in voltage level of the first and second reference levels generated by the first and second reference level generator circuits 10 and 20, it is preferable that the word level generator generates a word level which is an intermediate level between the first and second reference levels Vref1 and Vref2 As illustrated in FIG. 6, the word level generator 30 comprises a voltage-divider circuit 31 connected to the first and second reference level generator circuits 10 and 20 for receiving the first and second reference levels to generate a voltage at a level between the first and second reference levels and a current-amplifier circuit 32 connected to the voltage-divider circuit 31 for receiving the output from the voltage-divider circuit 31 to conduct an amplification in current of the output from the voltage-divider circuit 31. The first reference level generator circuit 10 comprises a first reference level supply circuit 11 for generating the first reference level signal and a first current amplifier circuit 12 connected to the first reference level supply circuit 11 for receiving the first reference level signal from the first reference level supply circuit 11 in order to conduct a current amplification of the first reference level signal. The second reference level generator circuit 20 comprises a second reference level supply circuit 21 for generating the second reference level signal and a second current amplifier circuit 22 connected to the second reference level supply circuit 21 for receiving the second reference level signal from the second reference level supply circuit 21 in order to conduct a current amplification of the second reference level signal.

Figure 7:
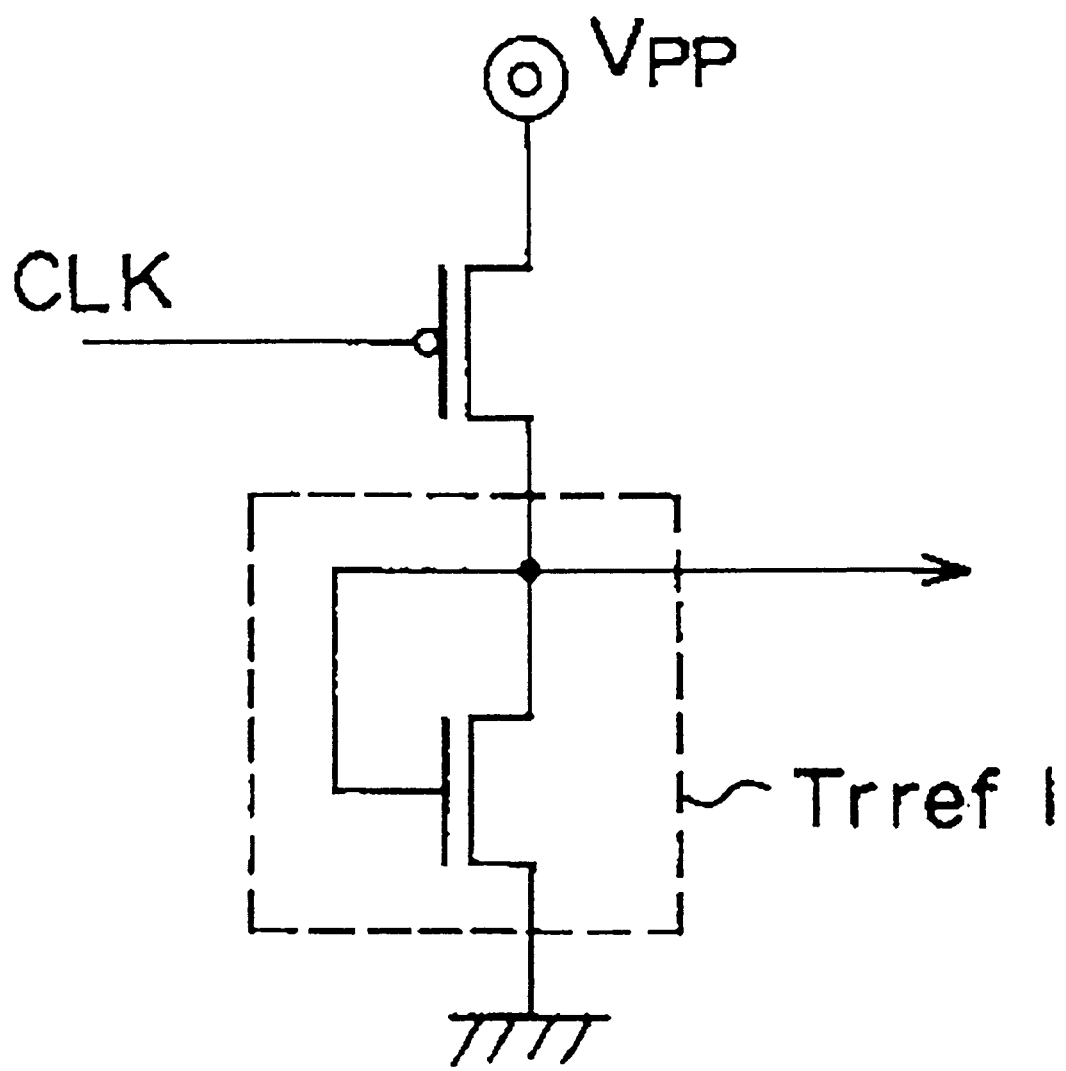
FIG. 7 is a circuit diagram illustrative of a first reference level supplying circuit in a novel word level generator of FIG. 6 in a first embodiment in accordance with the present invention.
Figure 10:
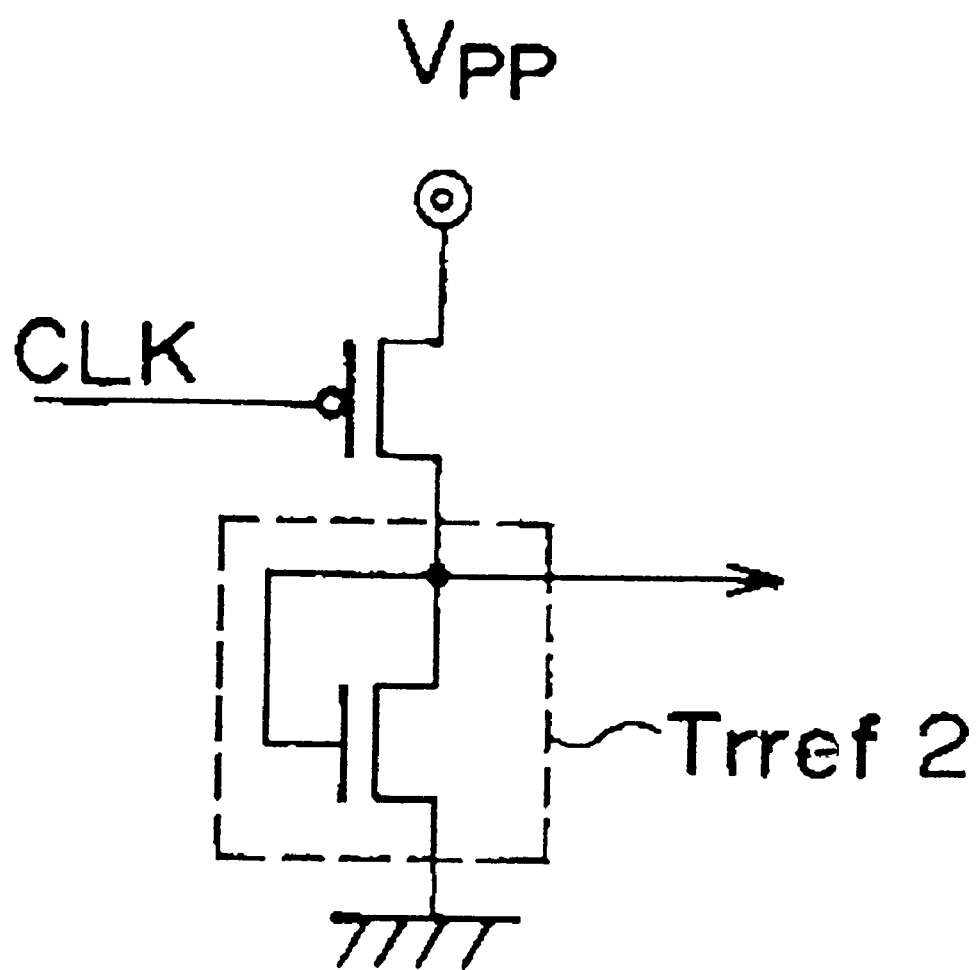
FIG. 10 is a circuit diagram illustrative of a second reference level supplying circuit in a novel word level generator of FIG. 6 in a first embodiment in accordance with the present inventions

As illustrated in FIGS. 7 and 10, the first reference level supply circuit 11 has a first reference MOS field effect transistor Trref1 having a first threshold voltage which corresponds to the first reference level. The second reference level supply circuit 21 has a second reference MOS field effect transistor Trref2 having a second threshold voltage which corresponds to the second reference level. Each of the first and second reference MOS field effect transistors Trref1 and Trref2 has a diode connection between a drain and a gate to allow the first and second MOS field effect transistors Trref1 and Trref2 to perform as diodes so that a drain voltage of the first MOS field effect transistor Trref1 is fetched as the first reference level signal and a drain voltage of the second MOS field effect transistor Trref2 is fetched as the second reference level signal. Each of the first and second reference MOS field effect transistors Trref1 and Trref2 is connected through a p-channel MOS field effect transistor to a high voltage line Vpp, where a gate of the p-channel MOS field effect transistor receives an input signal CLK so as to decide whether the circuit is activated or inactivated. A plurality of the above circuits of FIG. 4 are provided in correspondence to different word levels for generating the different word levels, wherein only the word level generator for generating the required word level is activated and other word level generators are inactivated.

Figure 8:
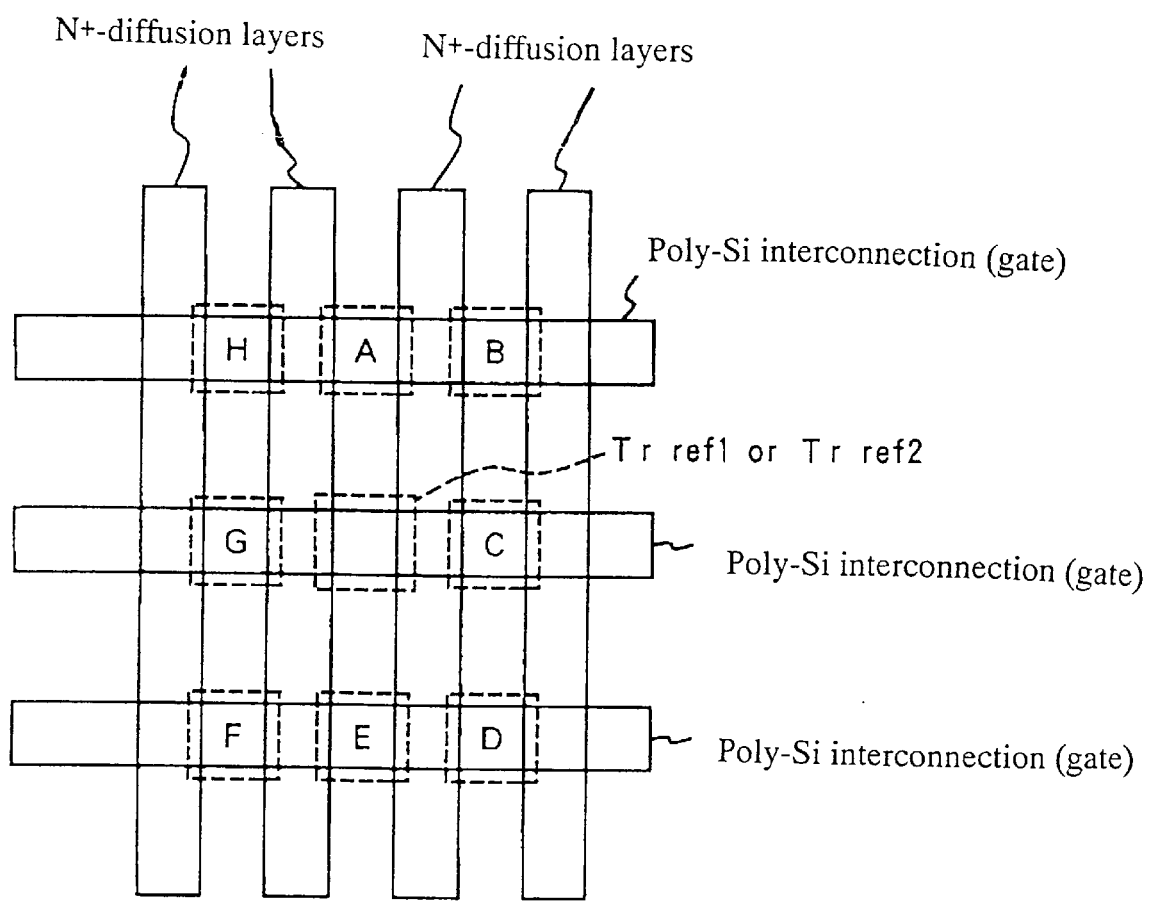
FIG. 8 is a fragmentary plan view illustrative of a first reference level MOS field effect transistor and peripheral MOS field effect transistors adjacent to and around the first reference level MOS field effect transistor in a first reference level supplying circuit of FIG. 7 in a first embodiment in accordance with the present invention.

As illustrated in FIG. 8, the first reference level generator circuit further has a first set of peripheral MOS field effect transistors A, B, C, D, E, F, G and H provided adjacent to and around the first reference MOS field effect transistor Trref1. The first reference MOS field effect transistor Trref1 has an impurity diffusion region having the same amount of impurity as an impurity diffusion region of a mask programmable read only memory cell which has a threshold voltage equal to the first predetermined threshold voltage Vth-low, whilst the first set of the peripheral MOS field effect transistors A, B, C, D, E, F, G and H have N+-impurity diffusion regions having the same amount of impurity as impurity diffusion regions of the mask programmable read only memory cells having the higher distribution HdtbVth, so that the threshold voltage of the first reference MOS field effect transistor Trref1 is increased to the maximum level Vvref1 of the lower distribution LdtbVth. As a result, the first reference MOS field effect transistor Trref1 can supply the first reference level Vref1 which corresponds to the maximum value of the lower distribution LdtbVth. The second reference level generator circuit further has a second set of peripheral MOS field effect transistors A, B, C, D, E, F, G and H provided adjacent to and around the second MOS field effect transistor Trref2. The second MOS field effect transistor Trref2 has an impurity diffusion region having the same amount of impurity as an impurity diffusion region of a mask programmable read only memory cell which has a threshold voltage equal to the second predetermined threshold voltage Vth-high. The second set of the peripheral MOS field effect transistors have impurity diffusion regions having the same amount of impurity as impurity diffusion regions of the mask programmable read only memory cells which has threshold voltages in the lower distribution LdtbVth, so that the threshold voltage of the second reference MOS field effect transistor Trref2 is decreased to the minimum level Vvref2 of the higher distribution HdtbVth, As a result, the second reference MOS field effect transistor Trref2 can supply the second reference level Vref2 which corresponds to the minimum value of the higher distribution HdtbVth.

Figure 9:
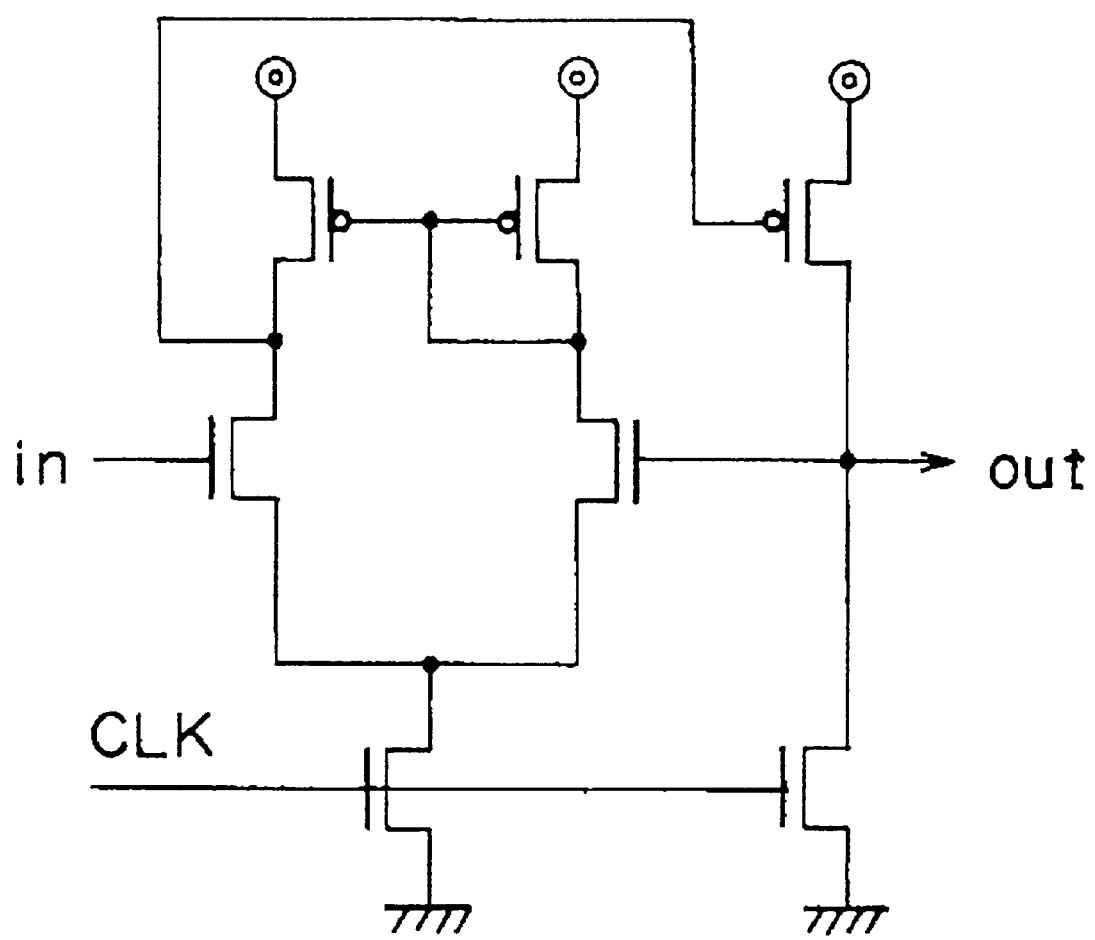
FIG. 9 is a circuit diagram illustrative of a first current amplifier circuit in a first reference level supplying circuit of FIG. 6 in a first embodiment in accordance with the present invention.

The first current amplifier circuit 12 is capable of amplifying a current of the first reference level signal Vref1 without changing the voltage level. The first current amplifier circuit 12 has a circuit configuration as illustrated in FIG. 9.

The second current amplifier circuit 22 is also capable of amplifying a current of the second reference level signal Vref2 without changing the voltage level.

Figure 11:
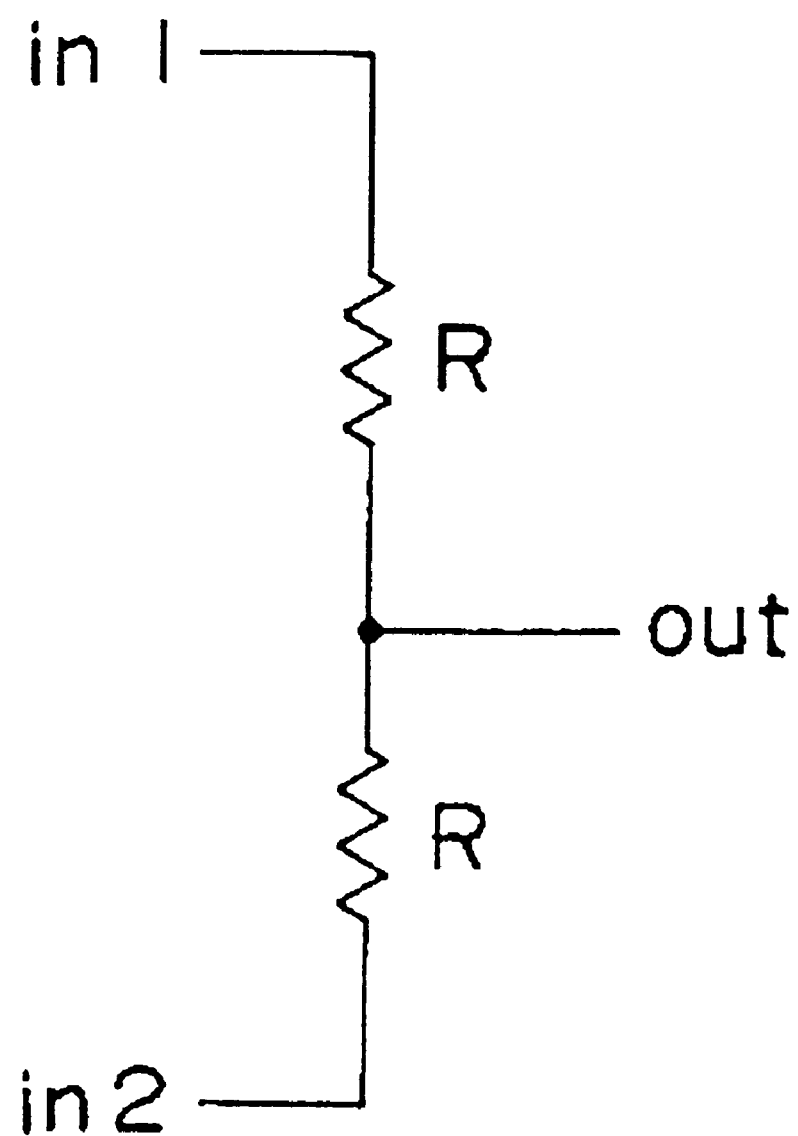
FIG. 11 is a circuit diagram illustrative of a voltage-divider circuit in a novel word level generator of FIG. 6 in a first embodiment in accordance with the present invention.

The voltage-divider circuit 31 receives the first and second reference level signals Vref1 and Vref2 from the first and second reference level generator circuits 10 and 20 in order to generate an intermediate voltage level between the first and second reference level signals Vref1 and Vref2. The voltage-divider circuit 31 may comprise two resistances R as illustrated in FIG. 11.

The current-amplifier circuit 32 is connected to the voltage-divider circuit 31 for receiving the output from the voltage-divider circuit 31 to conduct an amplification in current of the output from the voltage-divider circuit 31.

SECOND EMBODIMENT

Figure 12:
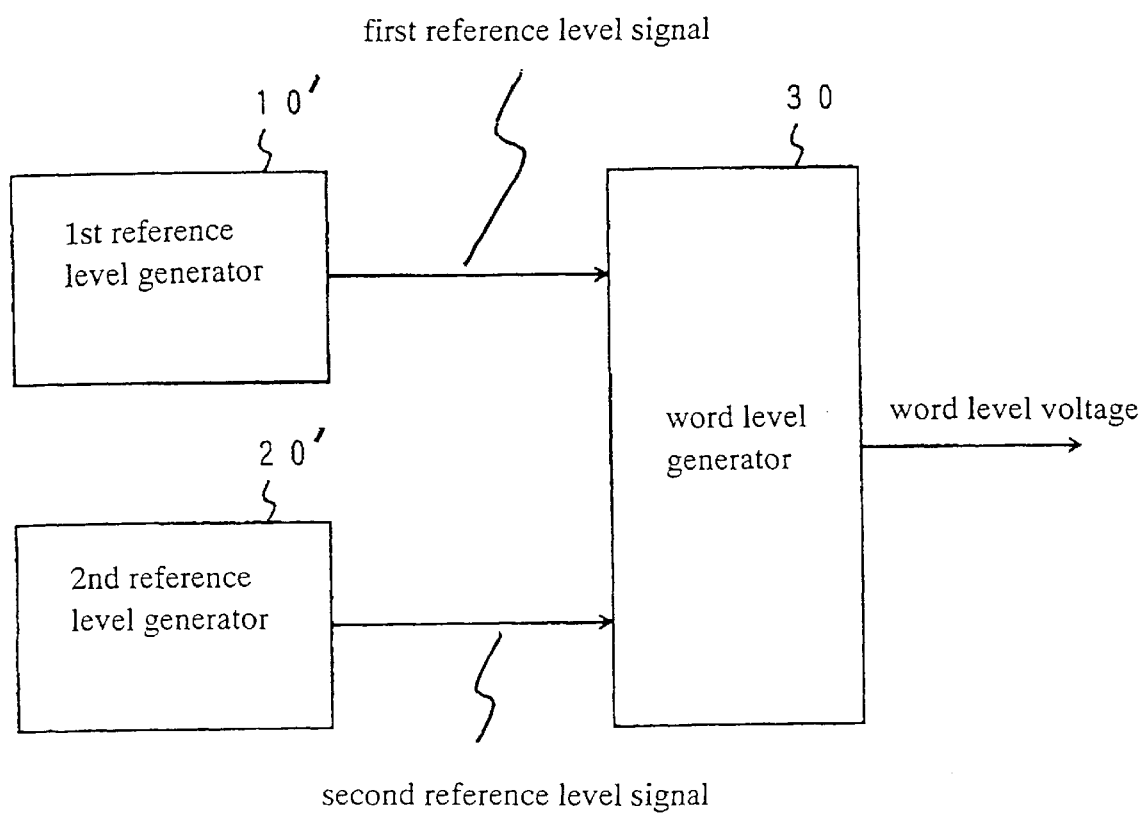
FIG. 12 is a block diagram illustrative of a novel word level generator provided for supplying word levels to mask programmable read only memory cells in a second embodiment in accordance with the present invention.
Figure 13:
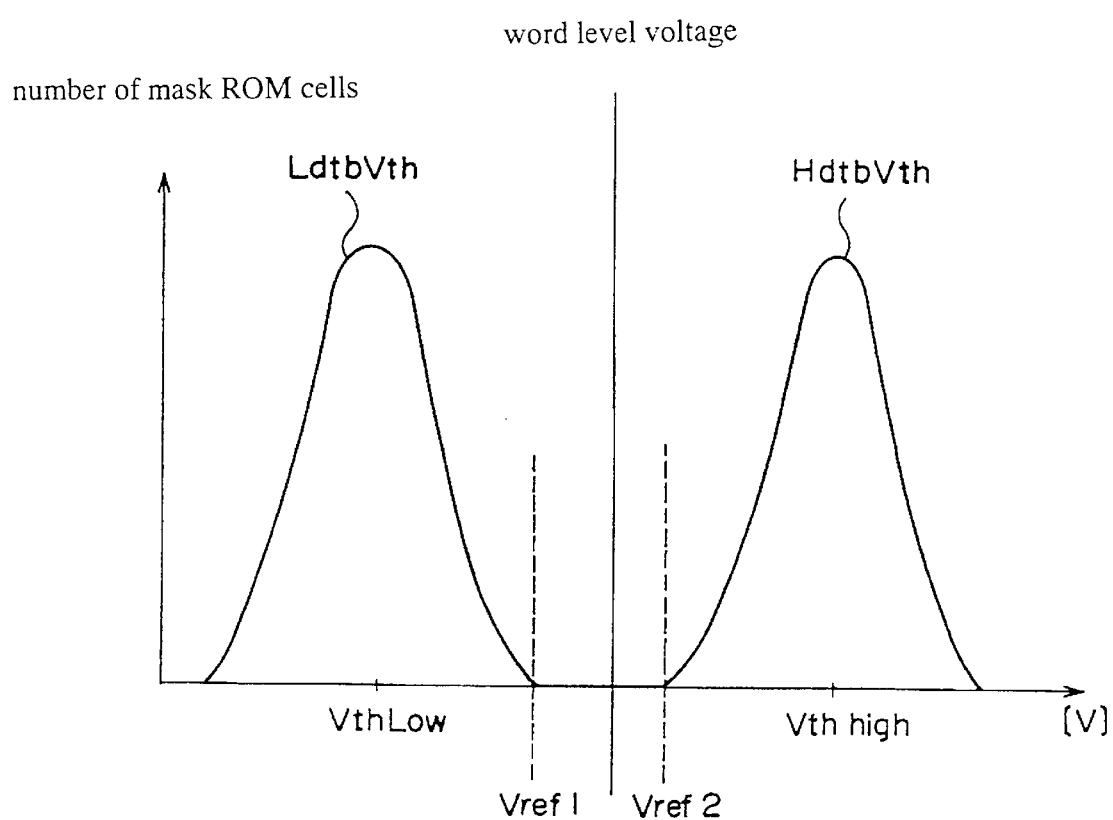
FIG. 13 is a graph illustrative of a relationship between a word level generated by a word level generator of FIG. 4 and adjacent two of distributions in threshold voltages of plural kinds of mask prograrmnable read only memory cells in a second embodiment in accordance with the present invention.
Figure 14:
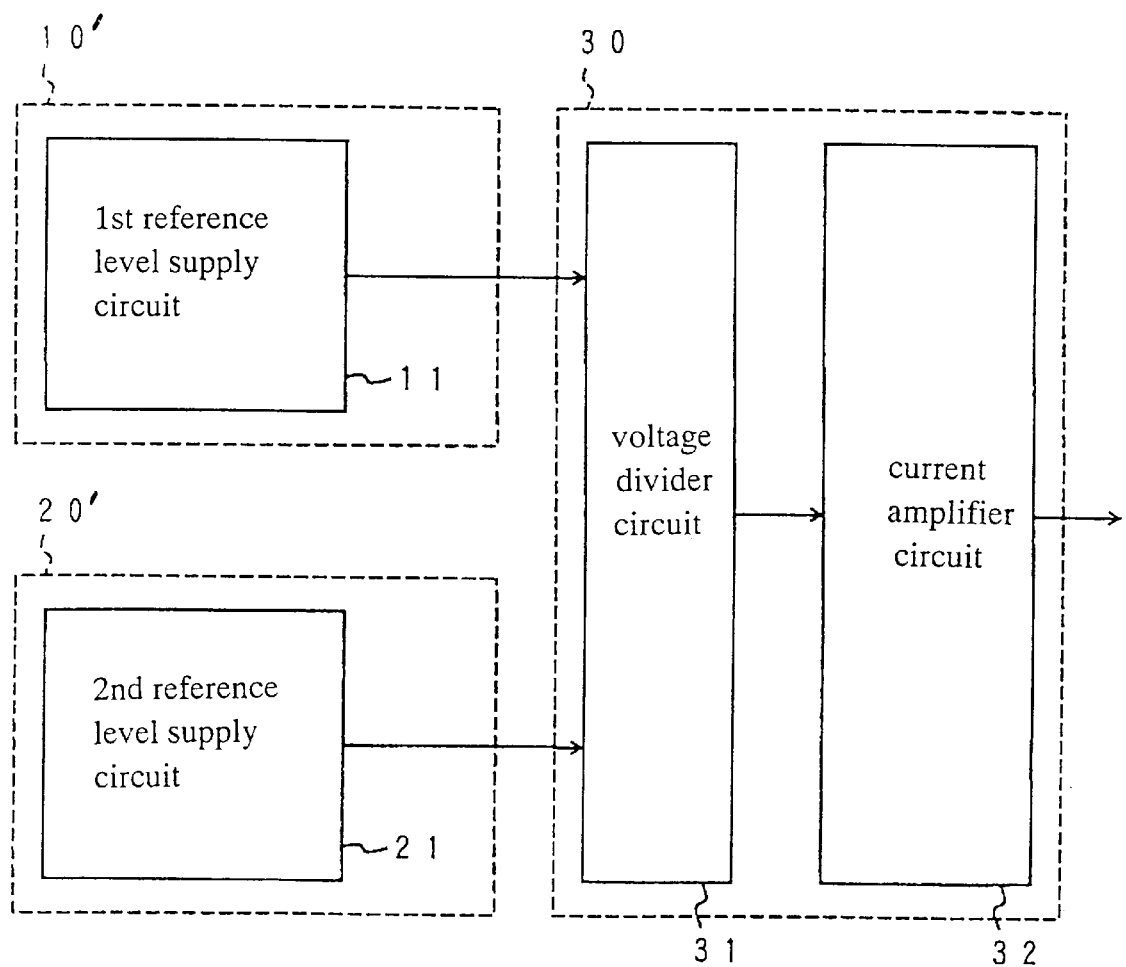
FIG. 14 is a block diagram illustrative of circuit configurations of a novel word level generator in a second embodiment in accordance with the present invention.

A second embodiment according to the present invention will be described in detail with reference to FIGS. 12 through 14. FIG. 12 is a block diagram illustrative of a novel word level generator provided for supplying word levels to mask programmable read only memory cells. FIG. 13 is a graph illustrative of a relationship between a word level generated by a word level generator of FIG. 12 and adjacent two of distributions in threshold voltages of plural kinds of mask programmable read only memory cells. FIG. 14 is a block diagram illustrative of circuit configurations of a novel word level generator.

The word level generator of this second embodiment is different from that of the first embodiment only in the circuit configurations of the first and second reference level generator circuits.

A novel word level generator is provided in a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages, and the distributions are separated from each other and have no overlap to each other, wherein the word level generator is capable of generating a word level which is between a maximum voltage level of lower one of adjacent two of the distributions and a minimum voltage level of higher one of the adjacent two of the distributions, so that all of the mask programmable read only memory cells are permitted to show correct ON/OFF operations for application of different word level voltages and whereby no incorrect data are obtained from the multiple-valued mask programmable read only memory semiconductor device.

As illustrated in FIGS. 12 and 13, the word level generator comprises a first reference level generator circuit 10' for generating a first reference level Vref1 which corresponds to a maximum value of the lower distribution LdtbVth, a second reference level generator circuit 20' for generating a second reference level Vref2 which corresponds to a minimum value of the higher distribution HdtbVth, and a word level generator 30 connected to the first and second reference level generator circuits 10' and 20' for receiving the first and second reference level signals from the first and second reference level generator circuits 10' and 20' in order to generate a word level which lies between the first and second reference levels Vref1 and Vref2. The lower distribution LdtbVth belongs to a lower predetermined threshold voltage Vth-low that the first kind of the mask programmable read only memory cells have been intended to have. The higher distribution HdtbVth belongs to a higher predetermined threshold voltage Vth-high that the first kind of the mask programmable read only memory cells have been intended to have. As a result, the word level generated by the word level generator does not overlap any of the lower and higher distributions LdtbVth and HdtbVth.

In considerations of a slight possibility of variations in voltage level of the first and second reference levels generated by the first and second reference level generator circuits 10, and 20', it is preferable that the word level generator generates a word level which is an intermediate level between the first and second reference levels Vref1 and Vref2.

As illustrated in FIG. 14, the word level generator 30 comprises a voltage-divider circuit 31 connected to the first and second reference level generator circuits 10' and 20' for receiving the first and second reference levels to generate a voltage at a level between the first and second reference levels and a current-amplifier circuit 32 connected to the voltage-divider circuit 31 for receiving the output from the voltage-divider circuit 31 to conduct an amplification in current of the output from the voltage-divider circuit 31. The first reference level generator circuit 10' comprises a first reference level supply circuit 11 for generating the first reference level signal. The second reference level generator circuit 20' comprises a second reference level supply circuit 21 for generating the second reference level signal.

The word level generated by the word level generator of this second embodiment is the same as in the first embodiment. Effects provided by the word level generator of this second embodiment are the same as in the first embodiment.

THIRD EMBODIMENT

Figure 15:
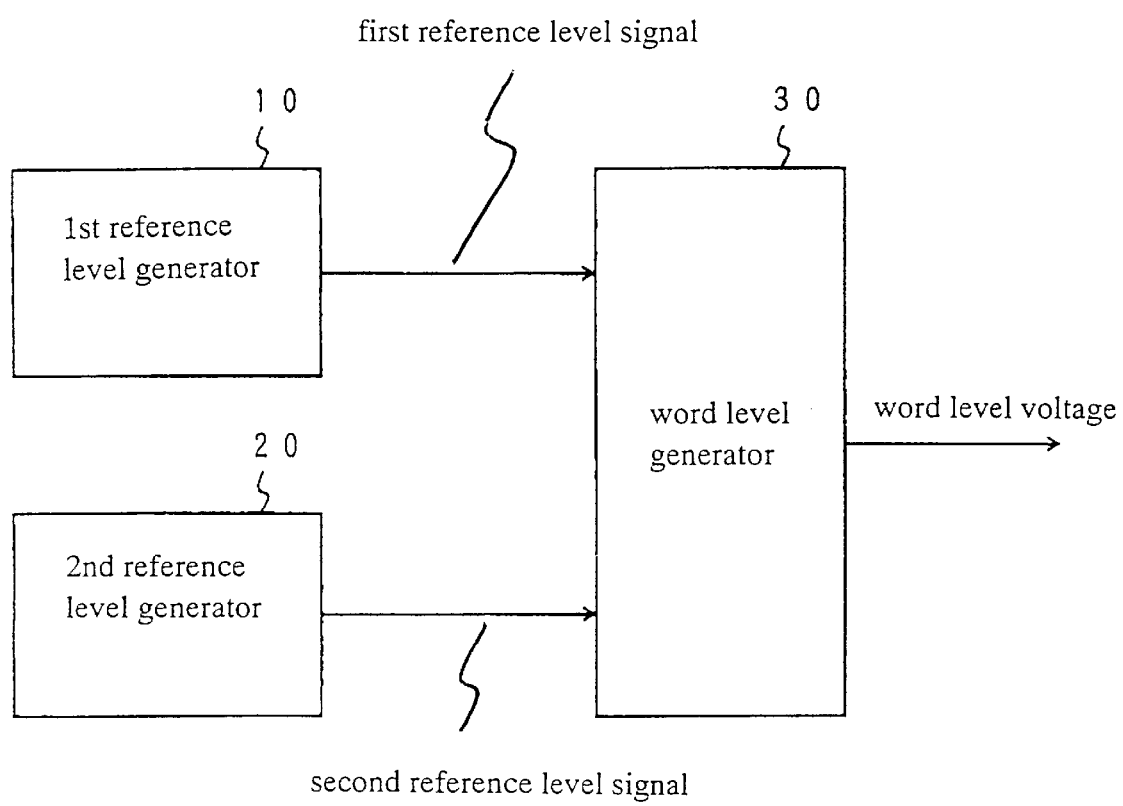
FIG. 15 is a block diagram illustrative of a novel word level generator provided for supplying word levels to mask programmable read only memory cells in a third embodiment in accordance with the present invention.
Figure 16:
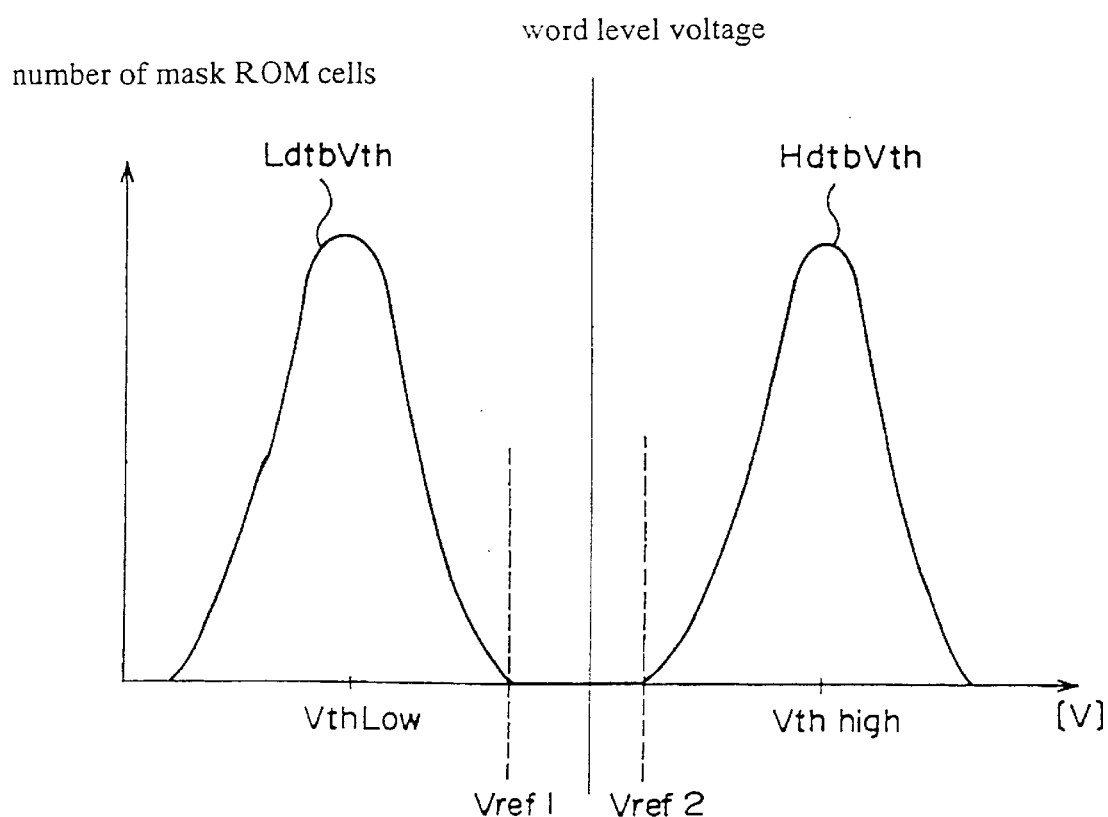
FIG. 16 is a graph illustrative of a relationship between a word level generated by a word level generator of FIG. 15 and adjacent two of distributions in threshold voltages of plural kinds of mask programmable read only memory cells in a third embodiment in accordance with the present invention.
Figure 17:
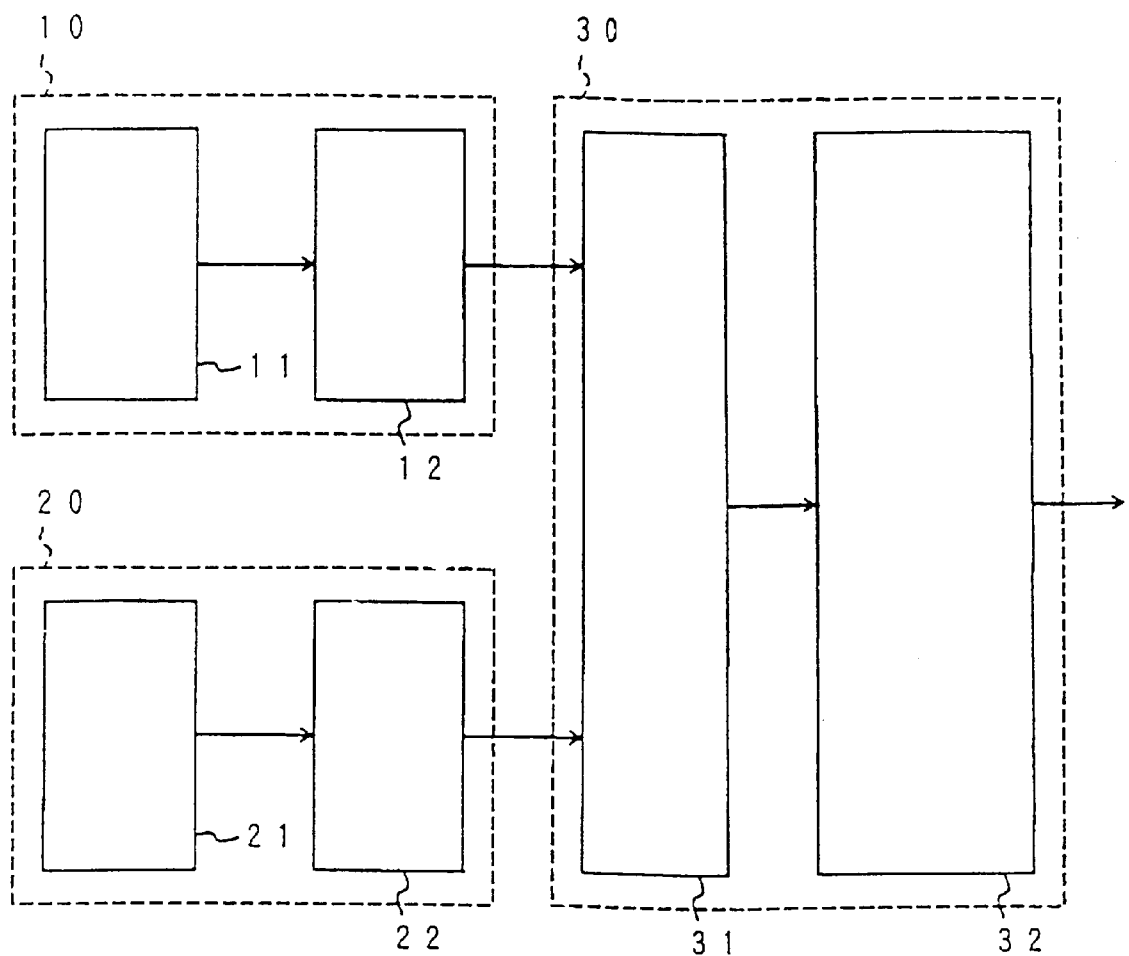
FIG. 17 is a block diagram illustrative of circuit configurations of a novel word level generator of FIG. 15 in a third embodiment in accordance with the present invention.
Figure 18:
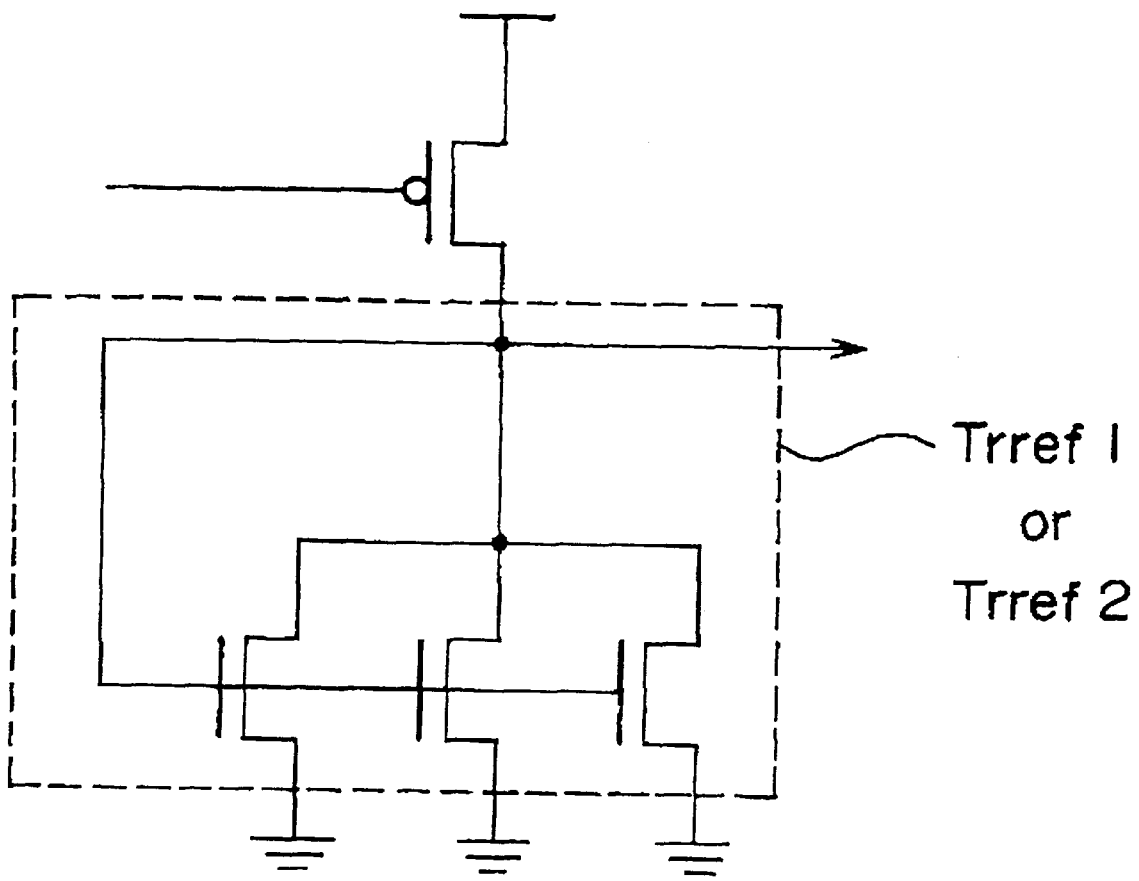
FIG. 18 is a circuit diagram illustrative of each of first and second reference level supplying circuits in a novel word level generator in a third embodiment in accordance with the present invention.
Figure 19:
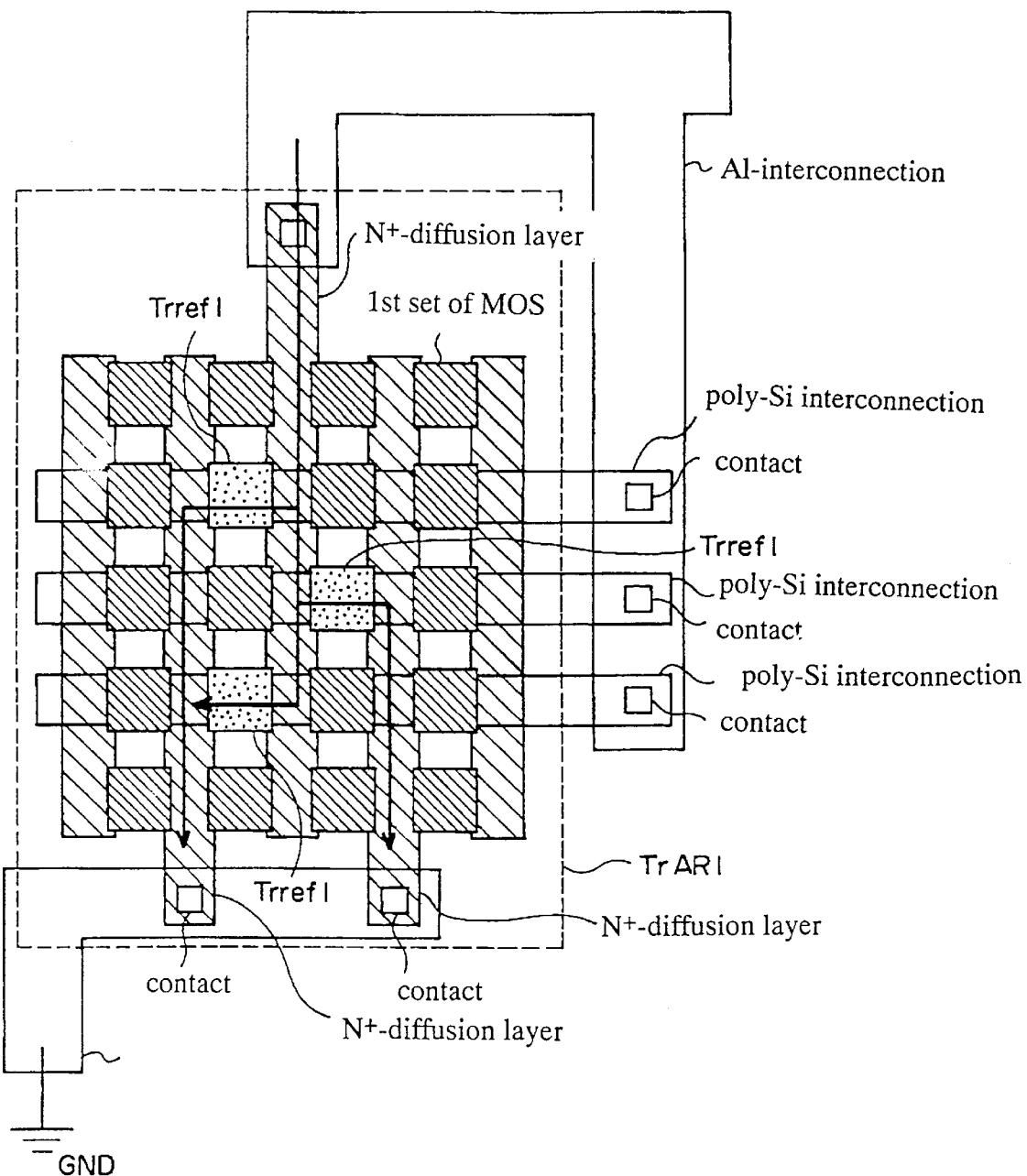
FIG. 19 is a fragmentary plan view illustrative of a first array comprising first reference level MOS field effect transistors and peripheral MOS field effect transistors adjacent to and around the first reference level MOS field effect transistors in each of first and second reference level supplying circuits in a third embodiment in accordance with the present invention.
Figure 20:
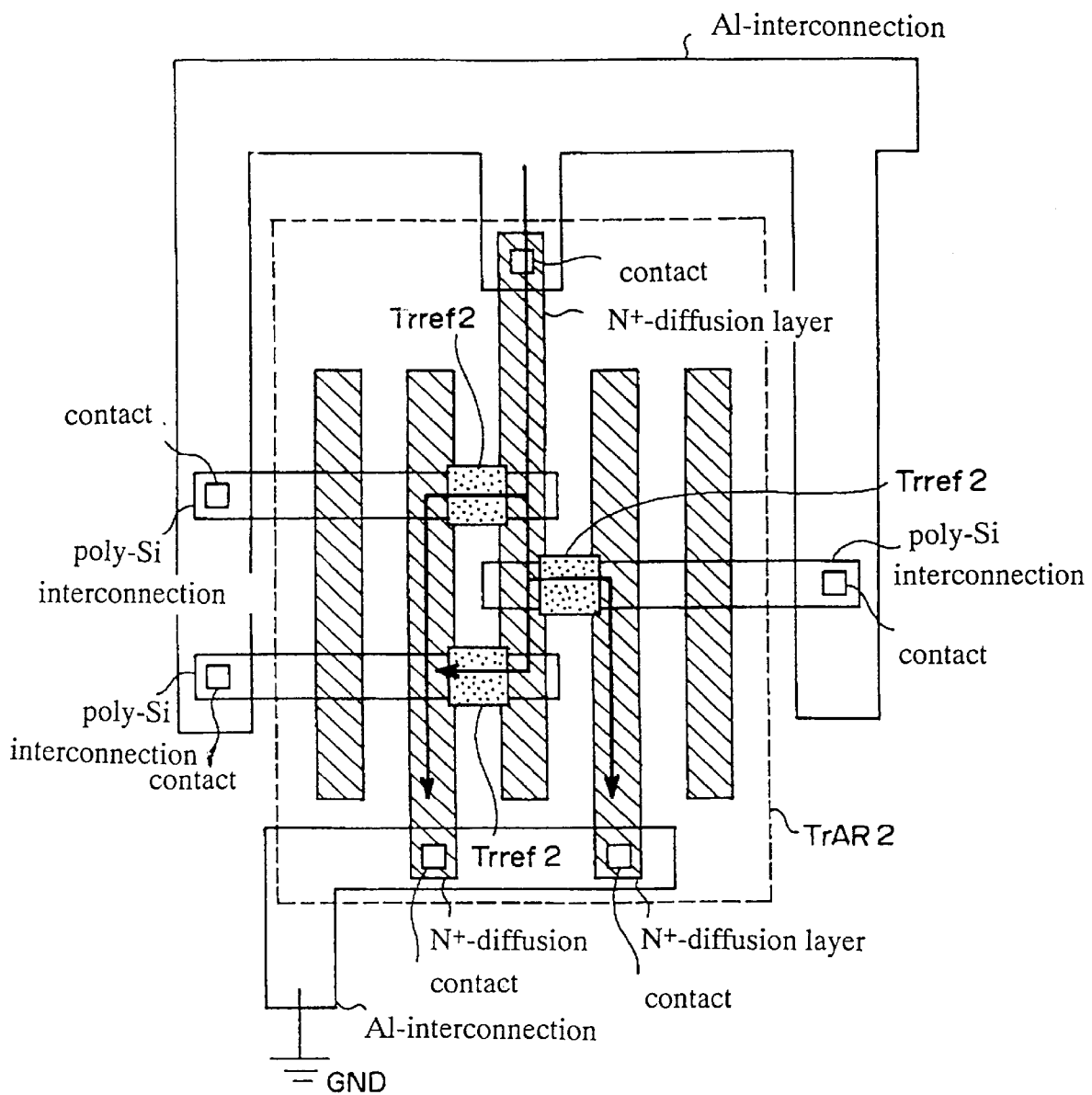
FIG. 20 is a fragmentary plan view illustrative of a second array comprising second reference level MOS field effect transistors and peripheral MOS field effect transistors adjacent to and around the second reference level MOS field effect transistors in each of first and second reference level supplying circuits in a third embodiment in accordance with the present invention.

A third embodiment according to the present invention will be described in detail with reference to FIGS. 15 through 19. FIG. 15 is a block diagram illustrative of a novel word level generator provided for supplying word levels to mask programmable read only memory cells. FIG. 16 is a graph illustrative of a relationship between a word level generated by a word level generator of FIG. 15 and adjacent two of distributions in threshold voltages of plural kinds of mask programmable read only memory cells. FIG. 17 is a block diagram illustrative of circuit configurations of a novel word level generator of FIG. 15. FIG. 18 is a circuit diagram illustrative of each of first and second reference level supplying circuits in a novel word level generator. FIG. 19 is a fragmentary plane view illustrative of a first aray comprising first reference level MOS field effect transistors and peripheral MOS field effect transistors adjacent to and around the first reference level MOS field effect transistors in each of first and second reference level supplying circuits. FIG. 20 is a fragmentary plane view illustrative of a second array comprising second reference level MOS field effect transistors and peripheral MOS field effect transistors adjacent to and around the second reference level MOS field effect transistors in each of first and second reference level supplying circuits.

A novel word level generator is provided in a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages, and the distributions are separated from each other and have no overlap to each other, wherein the word level generator is capable of generating a word level which is between a maximum voltage level of lower one of adjacent two of the distributions and a minimum voltage level of higher one of the adjacent two of the distributions, so that all of the mask programmable read only memory cells are permitted to show correct ON/OFF operations for application of different word level voltages and whereby no incorrect data are obtained from the multiple-valued mask programmable read only memory semiconductor device.

As illustrated in FIGS. 15 and 16, the word level generator comprises a first reference level generator circuit 10 for generating a first reference level Vref1 which corresponds to a maximum value of the lower distribution LdtbVth, a second reference level generator circuit 20 for generating a second reference level Vref2 which corresponds to a minimum value of the higher distribution Ildtbvth, and a word level generator 30 connected to the first and second reference level generator circuits 10 and 20 for receiving the first and second reference level signals from the first and second reference level generator circuits 10 and 20 in order to generate a word level which lies between the first and second reference levels Vref1 and Vref2. The lower distribution LdtbVth belongs to a lower predetermined threshold voltage Vth-low that the first kind of the mask programmable read only memory cells have been intended to have. The higher distribution HdtbVth belongs to a higher predetermined threshold voltage Vth-high that the first kind of the mask programmable read only memory cells have been intended to have. As a result, the word level generated by the word level generator does not overlap any of the lower and higher distributions LdtbVth and HdtbVth.

In considerations of a slight possibility of variations in voltage level of the first and second reference levels generated by the first and second reference level generator circuits 10 and 20, it is preferable that the word level generator generates a word level which is an intermediate level between the first and second reference levels Vref1 and Vref2.

As illustrated in FIG. 17, the word level generator 30 comprises a voltage-divider circuit 31 connected to the first and second reference level generator circuits 10 and 20 for receiving the first and second reference levels to generate a voltage at a level between the first and second reference levels and a current-amplifier circuit 32 connected to the voltage-divider circuit 31 for receiving the output from the voltage-divider circuit 31 to conduct an amplification in current of the output from the voltage-divider circuit 31. The first reference level generator circuit 10 comprises a first reference level supply circuit 11 for generating the first reference level signal and a first current amplifier circuit 12 connected to the first reference level supply circuit 11 for receiving the first reference level signal from the first reference level supply circuit 11 in order to conduct a current amplification of the first reference level signal. The second reference level generator circuit 20 comprises a second reference level supply circuit 21 for generating the second reference level signal and a second current amplifier circuit 22 connected to the second reference level supply circuit 21 for receiving the second reference level signal from the second reference level supply circuit 21 in order to conduct a current amplification of the second reference level signal.

As illustrated in FIG. 18, the first reference level supply circuit 11 has a parallel connection of three first reference MOS field effect transistors Trref1 having a first threshold voltage which corresponds to the first reference level. The second reference level supply circuit 21 also has a parallel connection of three second reference MOS field effect transistors Trref2 having a second threshold voltage which corresponds to the second reference level. Each of the first and second reference MOS field effect transistors Trref1 and Trref2 has diode connections between drains and gates to allow the first and second MOS field effect transistors Trref1 and Trref2 to perform as diodes so that a drain voltage of the first MOS field effect transistor Trref1 is fetched as the first reference level signal and a drain voltage of the second MOS field effect transistor Trref2 is fetched as the second reference level signal. The three first reference MOS field effect transistors Trref1 are connected through a p-channel MOS field effect transistor to a high voltage line Vcc, where a gate of the p-channel MOS field effect transistor receives an input signal CLK so as to decide whether the circuit is activated nor inactivated. The three second reference MOS field effect transistors Trref2 are also connected through a p-channel MOS field effect transistor to a high voltage line Vcc, where a gate of the p-channel MOS field effect transistor receives an input signal CLK so as to decide whether the circuit is activated nor inactivated.

The three first reference MOS field effect transistors Trref1 are provided as illustrated in FIG. 19. In addition, a first set of peripheral MOS field effect transistors are provided adjacent to and around the first reference MOS field effect transistor Trref1. The three first reference MOS field effect transistor Trref1 have an impurity diffusion region having the same amount of impurity as an impurity diffusion region of a mask programmable read only memory cell which has a threshold voltage equal to the first predetermined threshold voltage Vth-low, whilst the first set of the peripheral MOS field effect transistors have N+-impurity diffusion regions having the same amount of impurity as impurity diffusion regions of the mask programmable read only memory cells having the higher distribution HdtbVth, so that the threshold voltage of the three first reference MOS field effect transistor Trref1 is increased to the maximum level Vvref1 of the lower distribution LdtbVth. As a result, the three first reference MOS field effect transistor Trref1 can supply the first reference level Vref1 which corresponds to the maximum value of the lower distribution LdtbVth.

The three second reference MOS field effect transistors Trref2 are provided as illustrated in FIG. 20. In addition, N+-diffusion regions are provided adjacent to and around the three second MOS field effect transistor Trref2. The three second MOS field effect transistor Trref2 have an impurity diffusion region having the same amount of impurity as an impurity diffusion region of a mask programmable read only memory cell which has a threshold voltage equal to the second predetermined threshold voltage Vth-high. The N+-diffusion regions have impurity diffusion regions having the same amount of impurity as impurity diffusion regions of the mask programmable read only memory cells which has threshold voltages in the lower distribution LdtbVtb, so that the threshold voltage of the three second reference MOS field effect transistor Trref2 is decreased to the minimum level Vvref2 of the higher distribution HdtbVth. As a result, the three second reference MOS field effect transistor Trref2 can supply the second reference level Vref2 which corresponds to the minimum value of the higher distribution HdtbVth.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed:

1. A word level generator in a multiple-valued mask programmable read only memory semiconductor device having a plurality of kinds of mask programmable read only memory cells having a plurality of distributions in number of the mask programmable read only memory cells versus variation of actual threshold voltages from predetermined threshold voltages, and the distributions being separated from each other and having no overlap to each other,
wherein the word level generator generates signals corresponding to a maximum voltage level of a lower one of an adjacent two of the distributions and a minimum voltage level of a higher one of the adjacent two of the distributions and generates a word level between the maximum and minimum voltage levels.

2. The word level generator as claimed in claim 1, wherein the word level generator comprises.
a first reference level generator circuit having a transistor with the same structure as the first kind of a mask programmable read only memory cells for generating a first reference level signal;
a second reference level generator circuit having a transistor with the same structure as the second kind of a mask programmable read only memory cells for generating a second reference level signal; and
a word level generator circuit connected to the first and second reference level generator circuits for receiving the first and second reference level signals from the first and second reference level generator circuits in order to generate a word level intermediate between the first and second reference level signals.

3. The word level generator as claimed in claim 1, wherein a plurality of the word level generator circuits are provided for individually generating different word levels which lie in individual intermediate ranges between adjacent pairs of the distributions.

4. A word level generator for a multi-valued programmable read only semiconductor memory device that has plural kinds of programmable read only memory cells, each of the plural kinds of cells having a distribution of a number of such cells versus a variation of actual threshold voltage from a defined threshold voltage, the distributions being separate from each other so that a maximum voltage value of a lower one of an adjacent pair of the distributions does not overlap a minimum voltage value of a minimum voltage of a higher one of the adjacent pair, the word level generator comprising:
a first reference level generator circuit for generating a first reference level which corresponds to the maximum value of the lower distribution;
a second reference level generator circuit for generating a second reference level which corresponds to the minimum value of the higher distribution; and
a word level generator circuit connected to the first and second reference level generator circuits for receiving the first and second reference levels from the first and second reference level generator circuits and for generating the word level which lies between the first and second reference levels.

5. The word level generator as claimed in claim 4, wherein the word level generator circuit generates a word level which is an intermediate level between the first and second reference levels.

6. The word level generator as claimed in claim 4, wherein the word level generator circuit comprises:
a voltage-divider circuit connected to the first and second reference level generator circuits for receiving the first and second reference levels to generate a voltage at a level between the first and second reference levels; and
a current-amplifier circuit connected to the voltage-divider circuit for receiving the output from the voltage-divider circuit to conduct an amplification in current of the output from the voltage-divider circuit.

7. The word level generator as claimed in claim 6, wherein the first reference level generator circuit comprises:
a first reference level generator circuit for generating the first reference level; and
a first current amplifier circuit connected to the first reference level generator circuit for receiving the first reference level from the first reference level generator circuit in order to conduct a current amplification of the first reference level, and wherein the second reference level generator circuit comprises:
- a second reference level generator circuit for generating the second reference level; and
- a second current amplifier circuit connected to the second reference level generator circuit for receiving the second reference level from the second reference level generator circuit in order to conduct a current amplification of the second reference level.

8. The word level generator as claimed in claim 7, wherein the first reference level generator circuit has at least a first MOS field effect transistor having a first threshold voltage which corresponds to the first reference level, and wherein the second reference level generator circuit has at least a second MOS field effect transistor having a second threshold voltage which corresponds to the second reference level.

9. The word level generator as claimed in claim 8, wherein each of the first and second MOS field effect transistors has a diode connection between a drain and a gate to allow the first and second MOS field effect transistors to perform as diodes so that a drain voltage of the first MOS field effect transistor is fetched as the first reference level signal and a drain voltage of the second MOS field effect transistor is fetched as the second reference level.

10. The word level generator as claimed in claim 8, wherein the first reference level generator circuit further has a first set of peripheral MOS field effect transistors provided adjacent to and around the first MOS field effect transistor, where the first MOS field effect transistor has an impurity diffusion region having the same amount of impurity as an impurity diffusion region of a mask programmable read only memory cell which has a threshold voltage equal to a first predetermined threshold voltage from which actual threshold voltages of the first kind of the mask programmable read only memory cells are varied with the lower distribution, whilst the first set of the peripheral MOS field effect transistors have impurity diffusion regions having the same amount of impurity as an impurity diffusion region of a mask programmable read only memory cell which has a predetermined threshold voltage belonging to a highest one of all the distributions, and wherein the second reference level generator circuit further has a second set of peripheral MOS field effect transistors provided adjacent to and around the second MOS field effect transistor, where the second MOS field effect transistor has an impurity diffusion region having the same amount of impurity as an impurity diffusion region of a mask programmable read only memory cell which has a threshold voltage equal to a second predetermined threshold voltage from which actual threshold voltages of the second kind of the mask programmable read only memory cells are varied with the higher distribution, whilst the second set of the peripheral MOS field effect transistors have impurity diffusion regions having the same amount of impurity as an impurity diffusion region of a mask programmable read only memory cell which a predetermined threshold voltage belonging to a lowest one of all the distributions.

11. A device for generating a word level that is both higher than a maximum voltage value of a first distribution in threshold voltage of first type mask programmable read only memory cells intended to have a first threshold voltage and lower than a minimum voltage value of a second distribution in threshold voltage of second type mask programmable read only memory cells intended to have a second threshold voltage, the first and second distributions being adjacent to each other and separated from each other to have no overlap so that the first distribution is lower in threshold voltage than the second distribution, the device comprising means for generating signals corresponding to the maximum and minimum voltage values and for generating the word level therebetween using the corresponding signals.

12. The device as claimed in claim 11, wherein the means for generating comprises:
- a first reference level generator circuit having a transistor with the same structure as the first type of the mask programmable read only memory cells for generating a first reference level signal;
- a second reference level generator circuit having a transistor with the same structure as the second type of the mask programmable read only memory cells for generating a second reference level signal; and
- a word level generator connected to the first and second reference level generator circuits for receiving the first and second reference level signals from the first and second reference level generator circuits in order to generate a word level intermediate between the first and second reference level signals.

13. The device as claimed in claim 11, wherein a plurality of said means for generating are provided for individually generating different word levels which lie in individual intermediate ranges between adjacent pairs of the distributions.

14. A device for generating a word level that is both higher than a maximum voltage value of a first distribution in threshold voltage of first type mask programmable read only memory cells intended to have a first threshold voltage and lower than a minimum voltage value of a second distribution in threshold voltage of second type mask programmable read only memory cells intended to have a second threshold voltage, the first and second distributions being adjacent to each other and separated from each other to have no overlap so that the first distribution is lower in threshold voltage than the second distribution, the device comprising:
- a first reference level generator circuit for generating a first reference level which corresponds to the maximum value of the first distribution;
- a second reference level generator circuit for generating a second reference level which corresponds to the minimum value of the second distribution; and
- a word level generator connected to the first and second reference level generator circuits for receiving the first and second reference levels from the first and second reference level generator circuits and for generating the word level which lies between the first and second reference levels.

15. The device as claimed in claim 14, wherein the word level generator generates a word level which is an intermediate level between the first and second reference levels.

16. The device as claimed in claim 14, wherein the word level generator comprises:
- a voltage-divider circuit connected to the first and second reference level generator circuits for receiving the first and second reference levels to generate a voltage at a level between the first and second reference levels; and
- a current-amplifier circuit connected to the voltage-divider circuit for receiving the output from the voltage-divider circuit to conduct an amplification in current of the output from the voltage-divider circuit.

17. The device as claimed in claim 16, wherein the first reference level generator circuit comprises:
- a first reference level generator circuit for generating the first reference level; and
- a first current amplifier circuit connected to the first reference level generator circuit for receiving the first reference level from the first reference level generator circuit in order to conduct a current amplification of the first reference level, and wherein the second reference level generator circuit comprises:
- a second reference level generator circuit for generating the second reference level; and
- a second current amplifier circuit connected to the second reference level generator circuit for receiving the second reference level from the second reference level generator circuit in order to conduct a current amplification of the second reference level.

18. The device as claimed in claim 17, wherein the first reference level generator circuit has at least a first MOS field effect transistor having a first threshold voltage which corresponds to the first reference level, and wherein the second reference level generator circuit has at least a second MOS field effect transistor having a second threshold voltage which corresponds to the second reference level.

19. The device as claimed in claim 18, wherein each of the first and second MOS field effect transistors has a diode connection between a drain and a gate to allow the first and second MOS field effect transistors to perform as diodes so that a drain voltage of the first MOS field effect transistor is fetched as the first reference level and a drain voltage of the second MOS field effect transistor is fetched as the second reference level.

20. The device as claimed in claim 18, wherein the first reference level generator circuit further has a first set of peripheral MOS field effect transistors provided adjacent to and around the first MOS field effect transistor, where the first MOS field effect transistor has an impurity diffusion region having the same amount of impurity as an impurity diffusion region of a mask programmable read only memory cell which has a threshold voltage equal to a first predetermined threshold voltage from which actual threshold voltages of the first kind of the mask programmable read only memory cells are varied with the first distribution, whilst the first set of the peripheral MOS field effect transistors have impurity diffusion regions having the same amount of impurity as an impurity diffusion region of a mask programmable read only memory cell which has a predetermined threshold voltage belonging to a highest one of all the distributions, and wherein the second reference level generator circuit further has a second set of peripheral MOS field effect transistors provided adjacent to and around the second MOS field effect transistor, where the second MOS field effect transistor has an impurity diffusion region having the same amount of impurity as an impurity diffusion region of a mask programmable read only memory cell which has a threshold voltage equal to a second predetermined threshold voltage from which actual threshold voltages of the second kind of the mask programmable read only memory cells are varied with the second distribution, whilst the second set of the peripheral MOS field effect transistors have impurity diffusion regions having the same amount of impurity as an impurity diffusion region of a mask programmable read only memory cell which a predetermined threshold voltage belonging to a lowest one of all the distributions.

21. A multiple-valued mask programmable read only memory semiconductor device comprising:
- a memory cell array including a plurality of kinds of mask programmable read only memory cells having a plurality of distributions in number of the mask programmable read only memory cells versus variation of actual threshold voltages from predetermined threshold voltages, and the distributions being separated from each other and having no overlap to each other;
- a sense amplifier connected to the mask programmable read only memory cells for sensing ON/OFF states of said mask programmable read only memory cells;
- a plurality of latch circuits connected to the sense amplifier for receiving output signals about the ON/OFF states from said sense amplifier to hold the output signals;
- a decoder circuit connected to the latch circuits for receiving the output signals from the latch circuits to decode the output signals into data about the ON/OFF states;
- a plurality of output buffer circuits connected to the decoder circuit for outputting the data about the ON/OFF states; and
- a word level generator connected to gates of the mask programmable read only memory cells for supplying at least one word level for controlling ON/OFF states of said mask programmable read only memory cells, wherein the word level generator generates voltages corresponding to a maximum voltage level of a lower one of an adjacent two of the distributions and a minimum voltage level of a higher one of the adjacent two of the distributions and generates a word level between the maximum and minimum voltage levels.

22. The multiple-valued mask programmable read only memory semiconductor device as claimed in claim 21, wherein the word level generator comprises:
- a first reference level generator circuit having a transistor with the same structure as a first kind of the mask programmable read only memory cells for generating a first reference level signal;
- a second reference level generator circuit having a transistor with the same structure as a second kind of the mask programmable read only memory cells for generating a second reference level signal; and
- a word level generator circuit connected to the first and second reference level generator circuits for receiving the first and second reference level signals from the first and second reference level generator circuits in order to generate a word level intermediate between the first and second reference levels.

23. The multiple-valued mask programmable read only memory semiconductor device as claimed in claim 21, wherein a plurality of the word level generator circuits are provided for individually generating different word levels which lie in individual intermediate ranges between adjacent pairs of the distributions.

24. A multiple-valued mask programmable read only memory semiconductor device comprising:
- a memory cell array including a plurality of kinds of mask programmable read only memory cells having a plurality of distributions in number of the mask programmable read only memory cells versus variation of actual threshold voltages from predetermined threshold voltages, and the distributions being separated from each other and having no overlap to each other;
- a sense amplifier connected to the mask programmable read only memory cells for sensing ON/OFF states of said mask programmable read only memory cells;

a plurality of latch circuits connected to the sense amplifier for receiving output signals about the ON/OFF states from said sense amplifier to hold the output signals;

a decoder circuit connected to the latch circuits for receiving the output signals from the latch circuits to decode the output signals into data about the ON/OFF states;

a plurality of output buffer circuits connected to the decoder circuit for outputting the data about the ON/OFF states; and a word level generator connected to gates of the mask programmable read only memory cells for supplying at least one word level for controlling ON/OFF states of said mask programmable read only memory cells, wherein the word level generator generates voltages corresponding to a maximum voltage level of a lower one of an adjacent two of the distributions and a minimum voltage level of a higher one of the adjacent two of the distributions and generates a word level between the maximum and minimum voltage levels, wherein the word level generator comprises, a first reference level generator circuit for generating a first reference level which corresponds to the maximum value of the lower distribution, a second reference level generator circuit for generating a second reference level which corresponds to the minimum value of the higher distribution, and a word level generator circuit connected to the first and second reference level generator circuits for receiving the first and second reference levels from the first and second reference level generator circuits in order to generate the word level which lies between the first and second reference levels.

25. The multiple-valued mask programmable read only memory semiconductor device as claimed in claim 24, wherein the word level generator circuit generates a word level which is an intermediate level between the first and second reference levels.

26. The multiple-valued mask programmable read only memory semiconductor device as claimed in claim 24, wherein the word level generator circuit comprises:

a voltage-divider circuit connected to the first and second reference level generator circuits for receiving the first and second reference levels to generate a voltage at a level between the first and second reference levels; and a current-amplifier circuit connected to the voltage-divider circuit for receiving the output from the voltage-divider circuit to conduct an amplification in current of the output from the voltage-divider circuit.

27. The multiple-valued mask programmable read only memory semiconductor device as claimed in claim 26, wherein the first reference level generator circuit comprises:

a first reference level generator circuit for generating the first reference level; and a first current amplifier circuit connected to the first reference level generator circuit for receiving the first reference level from the first reference level generator circuit in order to conduct a current amplification of the first reference level, and wherein the second reference level generator circuit comprises:

a second reference level generator circuit for generating the second reference level; and a second current amplifier circuit connected to the second reference level generator circuit for receiving the second reference level from the second reference level generator circuit in order to conduct a current amplification of the second reference level.

28. The multiple-valued mask programmable read only memory semiconductor device as claimed in claim 27, wherein the first reference level generator circuit has at least a first MOS field effect transistor having a first threshold voltage which corresponds to the first reference level, and wherein the second reference level generator circuit has at least a second MOS field effect transistor having a second threshold voltage which corresponds to the second reference level.

29. The multiple-valued mask programmable read only memory semiconductor device as claimed in claim 28, wherein each of the first and second MOS field effect transistors has a diode connection between a drain and a gate to allow the first and second MOS field effect transistors to perform as diodes so that a drain voltage of the first MOS field effect transistor is fetched as the first reference level and a drain voltage of the second MOS field effect transistor is fetched as the second reference level.

30. The multiple-valued mask programmable read only memory semiconductor device as claimed in claim 28, wherein the first reference level generator circuit further has a first set of peripheral MOS field effect transistors provided adjacent to and around the first MOS field effect transistor, where the first MOS field effect transistor has an impurity diffusion region having the same amount of impurity as an impurity diffusion region of a mask programmable read only memory cell which has a threshold voltage equal to a first predetermined threshold voltage from which actual threshold voltages of the first kind of the mask programmable read only memory cells are varied with the lower distribution, whilst the first set of the peripheral MOS field effect transistors have impurity diffusion regions having the same amount of impurity as an impurity diffusion region of a mask programmable read only memory cell which has a predetermined threshold voltage belonging to a highest one of all the distributions, and wherein the second reference level generator circuit further has a second set of peripheral MOS field effect transistors provided adjacent to and around the second MOS field effect transistor, where the second MOS field effect transistor has an impurity diffusion region having the same amount of impurity as an impurity diffusion region of a mask programmable read only memory cell which has a threshold voltage equal to a second predetermined threshold voltage from which actual threshold voltages of the second kind of the mask programmable read only memory cells are varied with the higher distribution, whilst the second set of the peripheral MOS field effect transistors have impurity diffusion regions having the same amount of impurity as an impurity diffusion region of a mask programmable read only memory cell which a predetermined threshold voltage belonging to a lowest one of all the distributions.

31. A method of determining a word level that is both higher than a maximum voltage value of a first distribution in threshold voltage of first type mask programmable read only memory cells intended to have a first threshold voltage and lower than a minimum voltage value of a second distribution in threshold voltage of second type mask programmable read only memory cells intended to have a second threshold voltage, provided that the first and second distributions are separated from each other to have no overlap so that the first distribution is lower in threshold voltage than the second distribution, the method comprising the steps of generating signals corresponding to the maximum and minimum voltage values, and generating the word level using the corresponding voltages.

* * * * *